(12) United States Patent
Chen et al.

(10) Patent No.: US 9,893,241 B2
(45) Date of Patent: Feb. 13, 2018

(54) LIGHT EMITTING DEVICE HAVING BONDING PADS FORMED THEREIN FOR PACKAGING

(71) Applicant: EPISTAR CORPORATION, Hsinchu (TW)

(72) Inventors: Chao-Hsing Chen, Hsinchu (TW); Jia-Kuen Wang, Hsinchu (TW); Tzu-Yao Tseng, Hsinchu (TW); Bo-Jiun Hu, Hsinchu (TW); Tsung-Hsun Chiang, Hsinchu (TW); Wen-Hung Chuang, Hsinchu (TW); Kuan-Yi Lee, Hsinchu (TW); Yu-Ling Lin, Hsinchu (TW); Chien-Fu Shen, Hsinchu (TW); Tsun-Kai Ko, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/350,893

(22) Filed: Nov. 14, 2016

(65) Prior Publication Data

US 2017/0141260 A1 May 18, 2017

(30) Foreign Application Priority Data

Nov. 13, 2015 (TW) .............................. 104137443 A

(51) Int. Cl.
*H01L 33/38* (2010.01)
*H01L 33/46* (2010.01)
*H01L 33/40* (2010.01)

(52) U.S. Cl.
CPC ............ *H01L 33/46* (2013.01); *H01L 33/382* (2013.01); *H01L 33/38* (2013.01); *H01L 33/405* (2013.01)

(58) Field of Classification Search
CPC ......... H01L 21/68707; H01L 21/67265; H01L 21/67306; H01L 21/68771; H01L 21/67346; H01L 21/6773; H01L 21/67057; H01L 33/46; H01L 33/382; H01L 33/405; H01L 33/38
See application file for complete search history.

(56) References Cited

U.S. PATENT DOCUMENTS 8,497,146 B2 * 7/2013 Odnoblyudov ..... H01L 33/0079
257/E31.124

* cited by examiner

*Primary Examiner* — Kyoung Lee
*Assistant Examiner* — Christina Sylvia
(74) *Attorney, Agent, or Firm* — Patterson + Sheridan, LLP

(57) ABSTRACT

A light-emitting device comprises a semiconductor stack comprising a first semiconductor layer, a second semiconductor layer, and an active layer formed between the first semiconductor layer and the second semiconductor layer; a first pad on the semiconductor stack; a second pad on the semiconductor stack, wherein the first pad and the second pad are separated from each other with a distance, which define a region between the first pad and the second pad on the semiconductor stack; and multiple vias penetrating the active layer to expose the first semiconductor layer, wherein the first pad and the second pad are formed on regions other than the multiple vias.

20 Claims, 31 Drawing Sheets

US 9,893,241 B2

LIGHT EMITTING DEVICE HAVING BONDING PADS FORMED THEREIN FOR PACKAGING

REFERENCE TO RELATED APPLICATION

This application claims the right of priority based on TW Application Serial No. 104137443, filed on Nov. 13, 2015, and the contents of which is hereby incorporated by reference in its entirety.

TECHNICAL FIELD

The application relates to a structure of a light-emitting device, and more particularly, to a light-emitting device comprising a semiconductor stack and a pad on the semiconductor stack.

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed and good optoelectronic property, such as stable emission wavelength. Therefore, light-emitting diodes are widely used in household appliances, equipment indicators, and optoelectronic products.

SUMMARY OF THE APPLICATION

A light-emitting device comprises a semiconductor stack comprising a first semiconductor layer, a second semiconductor layer, and an active layer formed between the first semiconductor layer and the second semiconductor layer; a first pad on the semiconductor stack; a second pad on the semiconductor stack, wherein the first pad and the second pad are separated from each other with a distance, which define a region between the first pad and the second pad on the semiconductor stack; and multiple vias penetrating the active layer to expose the first semiconductor layer, wherein the first pad and the second pad are formed on regions other than the multiple vias.

A light-emitting device comprises a semiconductor stack comprising a first semiconductor layer, a second semiconductor layer, and an active layer formed between the first semiconductor layer and the second semiconductor layer; a first contact layer on the second semiconductor layer, surrounding a sidewall of the second semiconductor layer, and connected to the first semiconductor layer; a second contact layer on the second semiconductor layer and connected to the second semiconductor layer; a first pad on the semiconductor stack and connected to the first contact layer; a second pad on the semiconductor stack and connected to the second contact layer, wherein the first pad and the second pad are separated from each other with a distance, which define a region between the first pad and the second pad, wherein the first contact layer on the second semiconductor layer surrounds the second contact layer from a top view of the light-emitting device.

DETAILED DESCRIPTION OF PREFERRED EMBODIMENTS

Figure 1A:
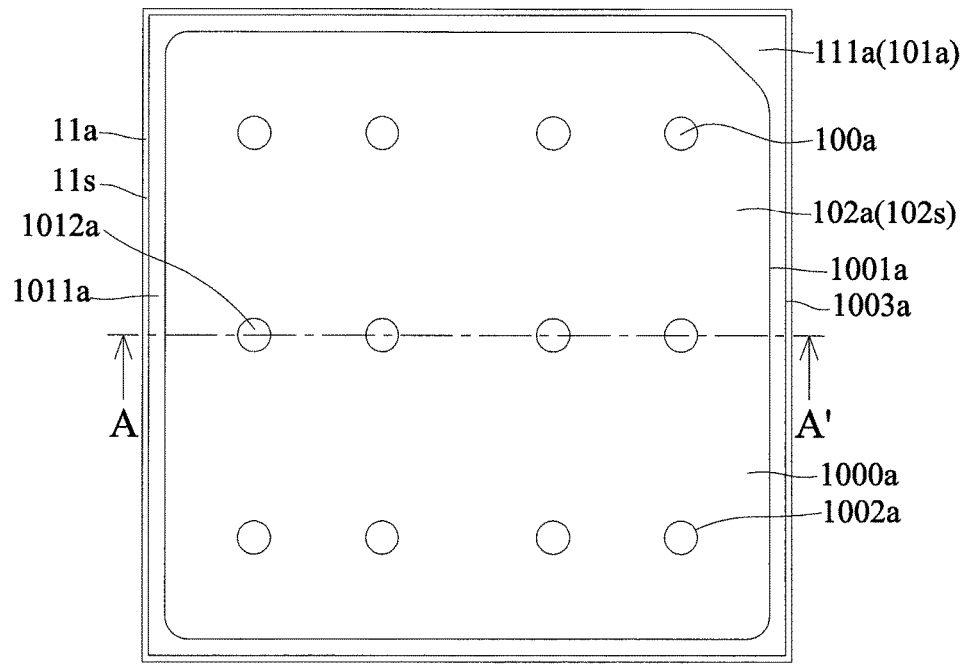
FIGS. 1A-7C illustrate a manufacturing method of a light-emitting device 1 or a light-emitting device 2 in accordance with embodiments of the present application.

The embodiment of the application is illustrated in detail, and is plotted in the drawings. The same or the similar part is illustrated in the drawings and the specification with the same number.

FIGS. 1A-11B illustrate a manufacturing method of a light-emitting device 1 or a light-emitting device 2 in accordance with embodiments of the present application.

Figure 1B:
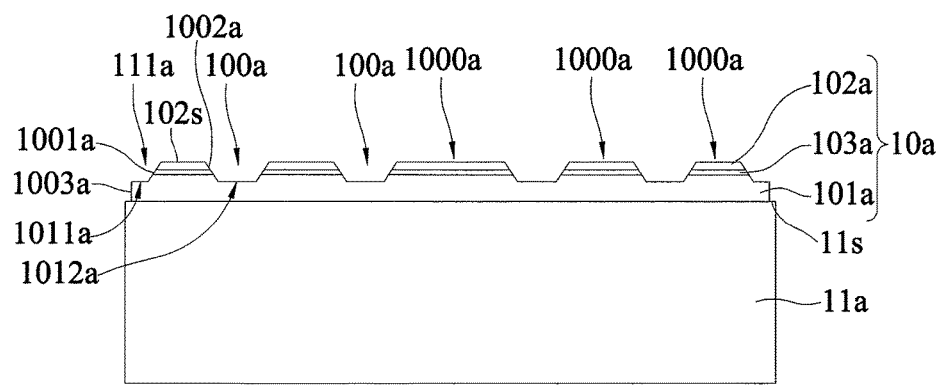

As a top view in FIG. 1A and a cross-sectional view in FIG. 1B which is taken along line A-A' of FIG. 1A show, the manufacturing method of the light-emitting device 1 or the light-emitting device 2 comprises a step of forming a mesa, which includes providing a substrate 11a and forming a semiconductor stack 10a on the substrate 11a, wherein the semiconductor stack 10a comprises a first semiconductor layer 101a, a second semiconductor layer 102a, and an active layer 103a between the first semiconductor layer 101a and the second semiconductor layer 102a. The semiconductor stack 10a can be patterned by lithography and etching to remove a portion of the second semiconductor layer 102a and the active layer 103a to form one or multiple semiconductor structures 1000a and to form a surrounding part 111a surrounding the one or multiple semiconductor structures 1000a. The surrounding part 111a exposes a first surface 1011a of the first semiconductor layer 101a. The one or multiple semiconductor structures 1000a comprises a first outside wall 1003a, a second outside wall 1001a, and an inside wall 1002a, wherein the first outside wall 1003a is a sidewall of the first semiconductor layer 101a, the second outside wall 1001a is a sidewall of the active layer 103a and/or a sidewall of the second semiconductor layer 102a. One end of the second outside wall 1001a is connected to a surface 102s of the second semiconductor layer 102a and another end of the second outside wall 1001a is connected to the first surface 1011a of the first semiconductor layer 101a. One end of the inside wall 1002a is connected to the surface 102s of the second semiconductor layer 102a and another end of the inside wall 1002a is connected to a second surface 1012a of the first semiconductor layer 101a. Multiple semiconductor structures 1000a are connected to each other through the first semiconductor layer 101a. As shown in FIG. 1B, an obtuse angle is formed between the inside wall 1002a of the semiconductor structure 1000a and the second surface 1012a of the first semiconductor layer 101a. An obtuse angle or a right angle is formed between the first outside wall 1003a of the semiconductor structure 1000a and a surface 11s of the substrate 11a. An obtuse angle is formed between the second outside wall 1001a of the semiconductor structure 1000a and the first surface 1011a of the first semiconductor layer 101a. The surrounding part 111a surrounds the semiconductor structure 1000a, the top view of the surrounding part 111a is a rectangular or a polygonal shape.

In an embodiment of the present application, the light-emitting device 1 or the light-emitting device 2 comprises a side less than 30 mil. When an external current is injected into the light-emitting device 1 or the light-emitting device 2, the semiconductor structure 1000a is surrounded by the surrounding part 111a to distribute the light field of the light-emitting device 1 or the light-emitting device 2 uniformly and reduce the forward voltage of the light-emitting device.

In an embodiment of the present application, the light-emitting device 1 or the light-emitting device 2 comprises a side larger than 30 mil. The semiconductor stack 10a can be patterned by lithography and etching to remove a portion of the second semiconductor layer 102a and the active layer 103a to form one or multiple vias 100a penetrating through the second semiconductor layer 102a and the active layer 103a, wherein the one or multiple vias 100a expose one or more second surface 1012a of the first semiconductor layer 101a. When an external current is injected into the light-emitting device 1 or the light-emitting device 2, the surrounding part 111a and the multiple vias 100a are dispersedly disposed to distribute the light field distribution of the light-emitting device 1 or the light-emitting device 2 uniformly and reduce the forward voltage of the light-emitting device.

In an embodiment of the present application, the light-emitting device 1 or the light-emitting device 2 comprises a side less than 30 mil, the light-emitting device 1 or the light-emitting device 2 does not comprise one or multiple vias 100a to increase a light-emitting area of the active layer.

In an embodiment of the present application, the one or multiple vias 100a comprises an opening having a shape, such as circular, ellipsoidal, rectangular, polygonal, or any shape. The multiple vias 100a can be arranged in a plurality of rows, and the vias 100a in the adjacent two rows can be aligned with each other or staggered.

In an embodiment of the present application, the substrate 11a can be a growth substrate, comprising gallium arsenide (GaAs) wafer for growing aluminum gallium indium phosphide (AlGaInP), sapphire ($Al_2O_3$) wafer, gallium nitride (GaN) wafer or silicon carbide (SiC) wafer for growing indium gallium nitride (InGaN). The semiconductor stack 10a comprises optical characteristics, such as light-emitting angle or wavelength distribution, and electrical characteristics, such as forward voltage or reverse current. The semiconductor stack 10a can be formed on the substrate 11a by organic metal chemical vapor deposition (MOCVD), molecular beam epitaxy (MBE), hydride vapor deposition (HVPE), or ion plating.

In an embodiment of the present application, the first semiconductor layer 101a and the second semiconductor layer 102a, such as a cladding layer or a confinement layer, have different conductivity types, electrical properties, polarities, or doping elements for providing electrons or holes. For example, the first semiconductor layer 101a is an n-type semiconductor, and the second semiconductor layer 102a is a p-type semiconductor. The active layer 103a is formed between the first semiconductor layer 101a and the second semiconductor layer 102a. The electrons and holes combine in the active layer 103a under a current driving to convert electric energy into light energy to emit a light. The wavelength of the light emitted from the light-emitting device 1 or the light-emitting device 2 is adjusted by changing the physical and chemical composition of one or more layers in the semiconductor stack 10a. The material of the semiconductor stack 10a comprises a group III-V semiconductor material, such as $Al_xIn_yGa_{(1-x-y)}N$ or $Al_xIn_yGa_{(1-x-y)}P$, wherein $0 \leq x$, $y \leq 1$; $(x+y) \leq 1$. According to the material of the active layer 103a, when the material of the semiconductor stack 10a is AlInGaP series material, red light having a wavelength between 610 nm and 650 nm or yellow light having a wavelength between 550 nm and 570 nm can be emitted. When the material of the semiconductor stack 10a is InGaN series material, blue light having a wavelength between 450 nm and 490 nm or green light having a wavelength between 490 nm and 550 nm can be emitted. When the material of the semiconductor stack 10a is AlGaN series material, UV light having a wavelength between 400 nm and 250 nm can be emitted. The active layer 103a can be a single heterostructure (SH), a double heterostructure (DH), a double-side double heterostructure (DDH), a multi-quantum well structure, MQW). The material of the active layer 103a can be i-type, p-type, or n-type semiconductor.

Figure 2A:
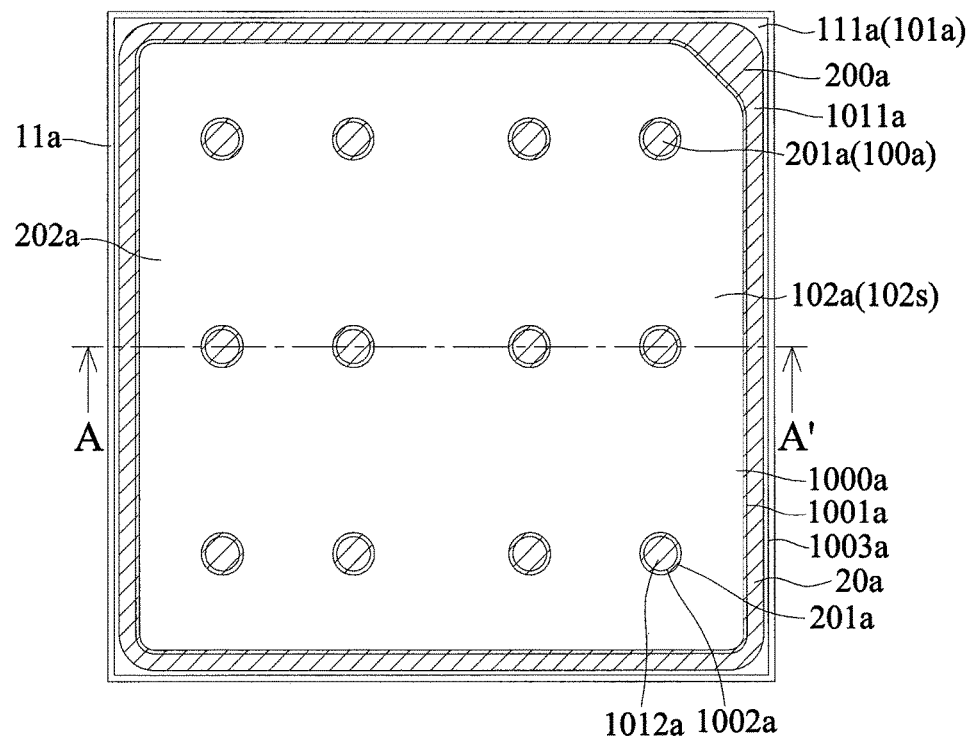
Figure 2B:
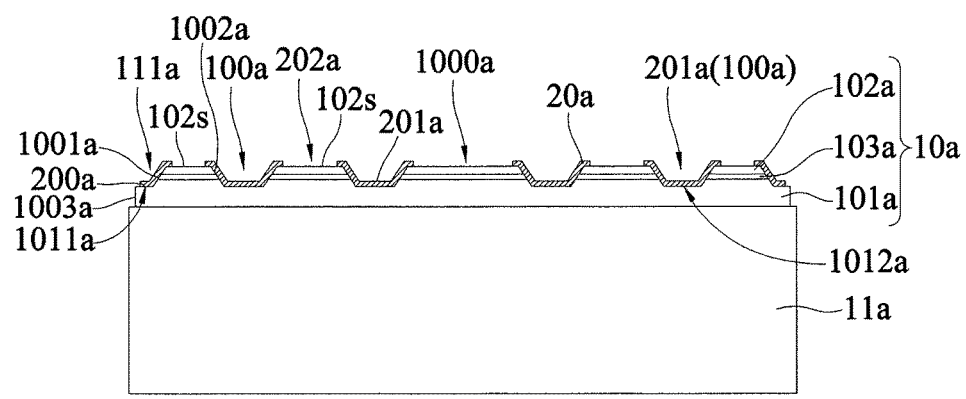

Following the step of forming the mesa, as a top view in FIG. 2A and a cross-sectional view in FIG. 2B which is taken along line A-A' of FIG. 2A show, the manufacturing method of the light-emitting device 1 or the light-emitting device 2 comprises a step of forming the first insulating layer. A first insulating layer 20a can be formed on the semiconductor structure 1000a by sputter or vapor deposition, and patterned by lithography and etching to cover the first surface 1011a of the surrounding part 111a and the second surface 1012a on the via 100a, and cover the second outside wall 1001a of the second semiconductor layer 102a and the active layer 103a of the semiconductor structure 1000a and the inside wall 1002a of the semiconductor structure 1000a. The first insulating layer 20a comprises a first insulating surrounding region 200a covering the surrounding part 111a, thereby the first surface 1011a of the first semiconductor layer 101a on the surrounding part 111a is covered by the first insulating surrounding region 200a; a first group of first insulating covering regions 201a covering the vias 100a, thereby the second surfaces 1012a of the first semiconductor layer 101a on the vias 100a are covered by the first group of first insulating covering regions 201a; and a second group of first insulating openings 202a exposing the surface 102s of the second semiconductor layer 102a. The first group of first insulating covering regions 201a is separated from each other, and is respectively corresponding to the multiple vias 100a. The first insulating layer 20a includes one layer or multiple layers. When the first insulating layer 20a includes one layer, the first insulating layer 20a protects the sidewall of the semiconductor structure 1000a to prevent the active layer 103a from being destroyed by the following processes. When the first insulating layer 20a includes multiple layers, the first insulating layer 20a includes two or more layers having different refractive indexes alternately stacked to form a Distributed Bragg reflector (DBR), which can selectively reflect light of a specific wavelength. The first insulating layer 20a is formed of a non-conductive material and comprises organic material, such as Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, fluorocarbon polymer, or inorganic material, such as silicone, glass, or dielectric material, such as aluminum oxide ($Al_2O_3$), silicon nitride ($SiN_x$), silicon oxide ($SiO_x$), titanium oxide ($TiO_x$), or magnesium fluoride ($MgF_x$).

Figure 3A:
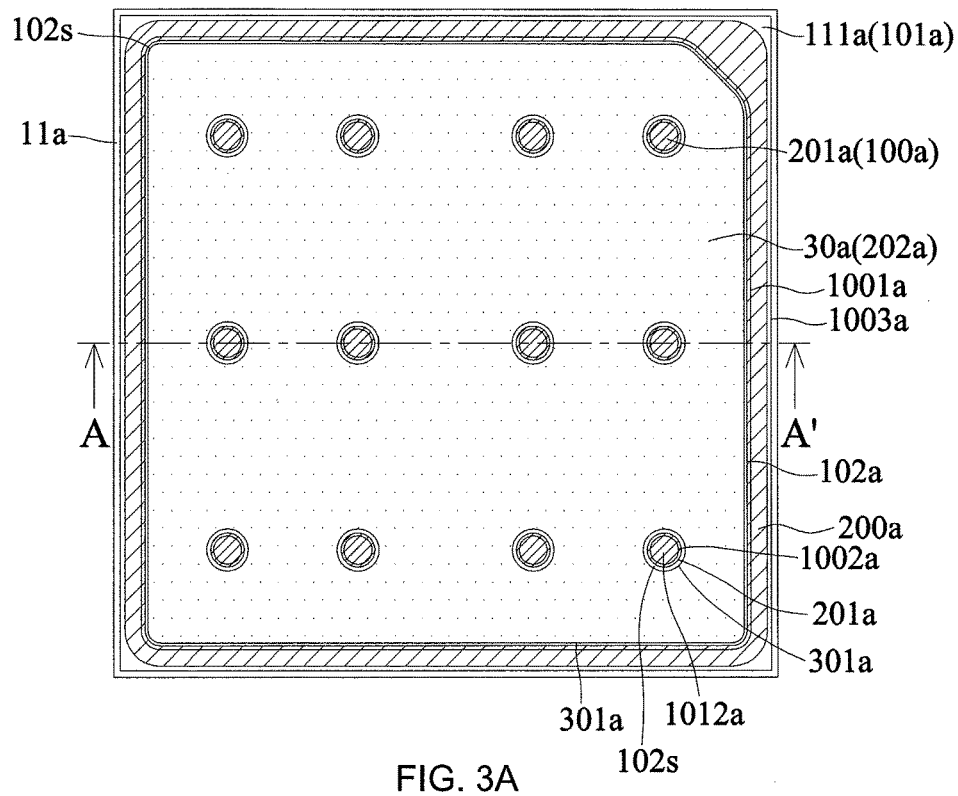
Figure 3B:
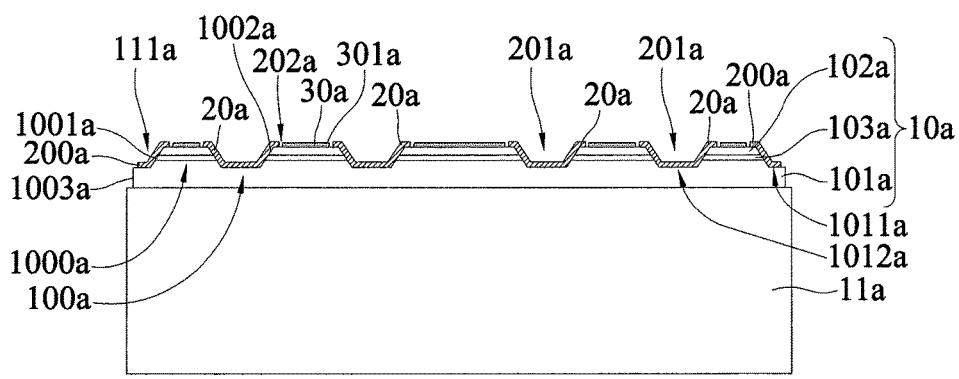

In an embodiment of the present application, following the step of forming the first insulating layer, as a top view in FIG. 3A and a cross-sectional view in FIG. 3B which is taken along line A-A' of FIG. 3A show, the manufacturing method of the light-emitting device 1 or the light-emitting device 2 comprises a step of forming the transparent conductive layer. A transparent conductive layer 30a can be formed in the second group of first insulating openings 202a by sputter, vapor deposition or the like, wherein an outer edge 301a of the transparent conductive layer 30a is spaced apart from the first insulating layer 20a with a distance to expose the surface 102s of the second semiconductor layer 102a. Since the transparent conductive layer 30a is substantially formed on the entire surface of the second semiconductor layer 102a and contacts the second semiconductor layer 102a, the current can be uniformly spread throughout the entire second semiconductor layer 102a by the transparent conductive layer 30a. The material of the transparent conductive layer 30a comprises a material being transparent to the light emitted from the active layer 103a, such as indium tin oxide (ITO) or indium zinc oxide (IZO).

In another embodiment of the present application, after the step of forming the mesa, the step of forming the transparent conductive layer can be performed first and is followed by the step of forming the first insulating layer.

In another embodiment of the present application, after the step of forming the mesa, the step of forming the first insulating layer can be omitted so the step of forming the transparent conductive layer can be directly performed.

Figure 4A:
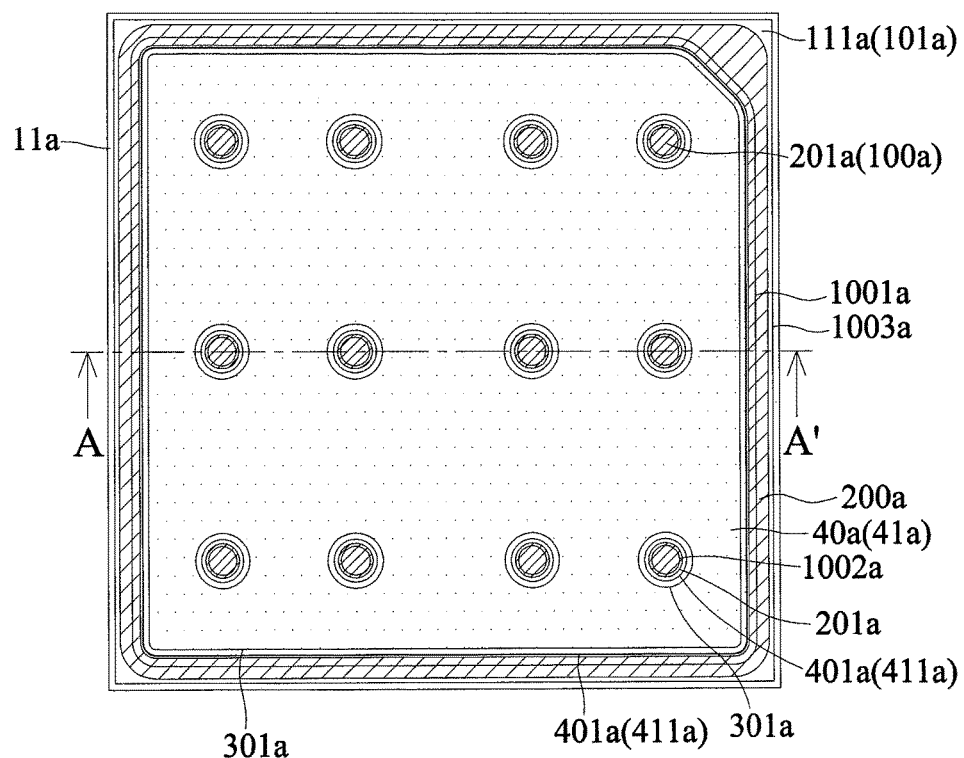
Figure 4B:
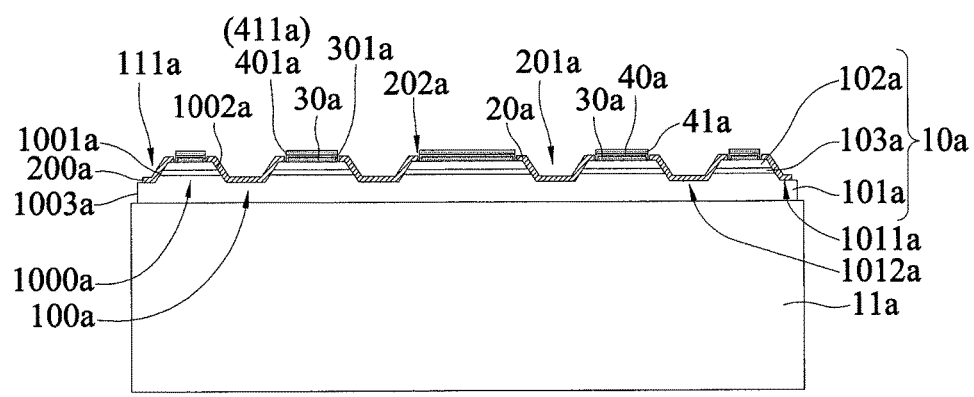

In an embodiment of the present application, following the step of forming the transparent conductive layer, as a top view in FIG. 4A and a cross-sectional view in FIG. 4B which is taken along line A-A' of FIG. 4A show, the manufacturing method of the light-emitting device 1 or the light-emitting device 2 comprises a step of forming the reflective structure. The reflective structure comprises a reflective layer 40a and/or a barrier layer 41a, which can be directly formed on the transparent conductive layer 30a by sputter, vapor deposition, or the like, wherein the reflective layer 40a is formed between the transparent conductive layer 30a and the barrier layer 41a. As the top view of the light-emitting device 1 or the light-emitting device 2 shows, an outer edge 401a of the reflective layer 40a can be disposed on the inner side or the outer side of the outer edge 301a of the transparent conductive layer 30a, or disposed to overlap with the outer edge 301a of the transparent conductive layer 30a, the outer edge 411a of the barrier layer 41a can be disposed on the inner side or the outer side of the outer edge 401a of the reflective layer 40a or provided to overlap with the outer edge 401a of the reflective layer 40a.

In another embodiment of the present application, the step of forming the transparent conductive layer can be omitted, and the step of forming the reflective structure is directly performed after the step of forming the mesa or the step of forming the first insulating layer. The reflective layer 40a and/or the barrier layer 41a is directly formed on the second semiconductor layer 102a, and the reflective layer 40a is formed between the second semiconductor layer 102a and the barrier layer 41a.

The reflective layer 40a includes one layer or multiple layers, such as a Distributed Bragg reflector (DBR). The material of the reflective layer 40a comprises a metal material having a high reflectance, for example, silver (Ag), aluminum (Al), or rhodium (Rh), or an alloy of the above materials. The high reflectance referred to herein means having 80% or more reflectance for a wavelength of a light emitted from the light-emitting device 1 or the light-emitting device 2. In an embodiment of the present application, the barrier layer 41a covers the reflective layer 40a to prevent the surface of the reflective layer 40a from being oxidized that deteriorates the reflectivity of the reflective layer 40a. The material of the barrier layer 41a comprises metal material, such as titanium (Ti), tungsten (W), aluminum (Al), indium (In), tin (Sn), nickel (Ni), platinum (Pt), or an alloy of the above materials. The barrier layer 41a includes one layer or multiple layers, such as titanium (Ti)/aluminum (Al) and/or titanium (Ti)/tungsten (W). In an embodiment of the present application, the barrier layer 41a comprises titanium (Ti)/aluminum (Al) on one side away from the reflective layer 40a and titanium (Ti)/tungsten (W) on another side adjacent to the reflective layer 40a. In one embodiment of the present application, the material of the reflective layer 40a and the barrier layer 41a preferably includes a metal material other than gold (Au) or copper (Cu).

Figure 5A:
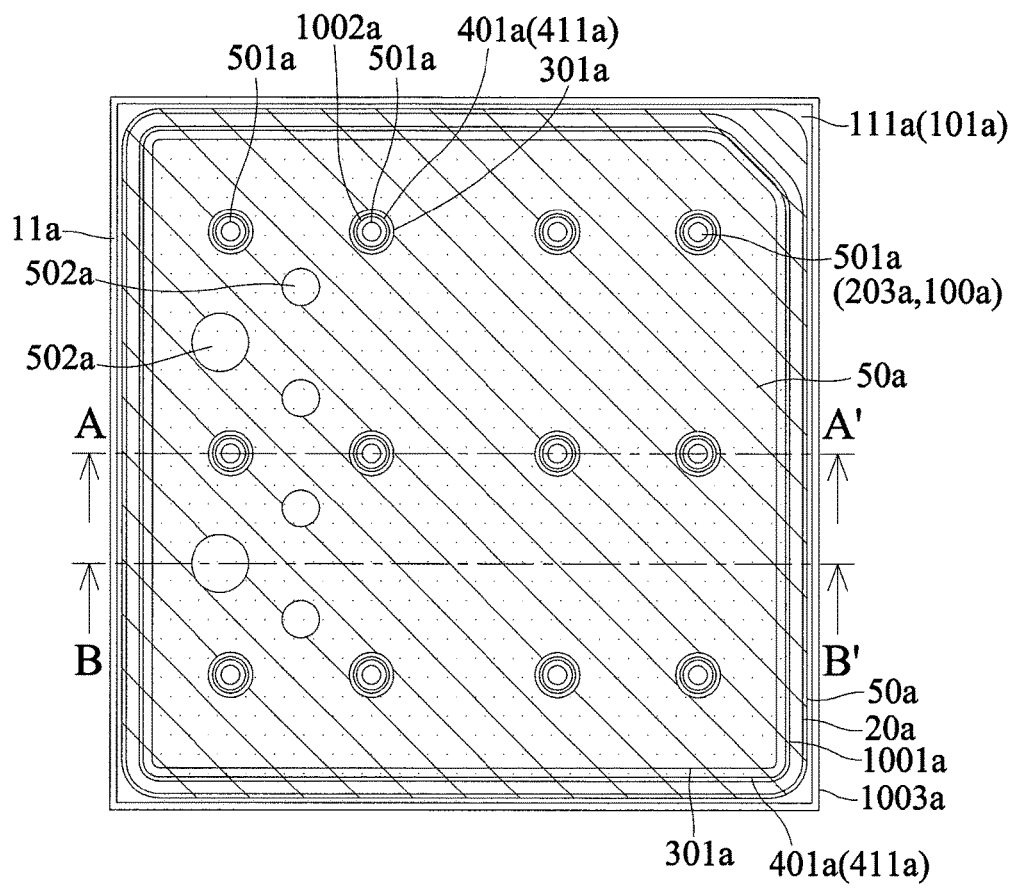
Figure 5B:
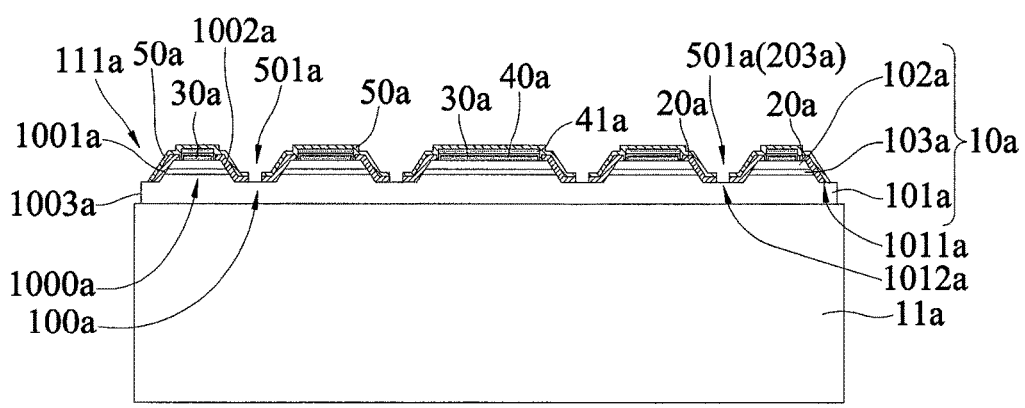
Figure 5C:
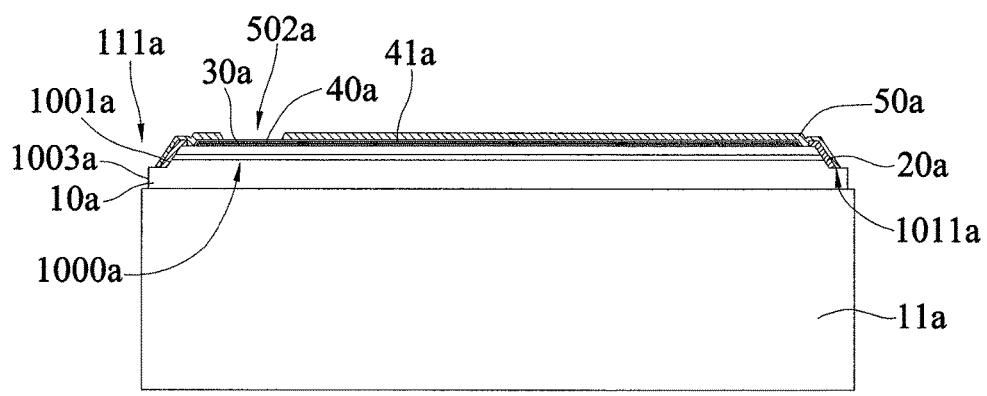

In an embodiment of the present application, following the step of forming the reflective structure, as a top view in FIG. 5A, a cross-sectional view in FIG. 5B which is taken along line A-A' of FIG. 5A, and a cross-sectional view in FIG. 5C which is taken along line B-B' of FIG. 5A show, the manufacturing method of the light-emitting device 1 or the light-emitting device 2 comprises a step of forming the second insulating layer. A second insulating layer 50a can be formed on the semiconductor structure 1000a by sputter or vapor deposition, etc., and then patterned by lithography and etching to form a first group of second insulating openings 501a to expose the first semiconductor layer 101a and a second group of second insulating openings 502a to expose the reflective layer 40a or the barrier layer 41a. During the patterning of the second insulating layer 50a, the first insulating surrounding region 200a which covers the surrounding part 111a and the first group of first insulating covering regions 201a formed in the vias 100a are partially etched to expose the first semiconductor layer 101a. A first group of first insulating layer openings 203a is formed in the vias 100a to expose the first semiconductor layer 101a. In the present embodiment, as the top view in FIG. 5A shows, the first group of second insulating openings 501a and the second group of second insulating openings 502a comprise different widths or numbers. The opening shape of the first group of second insulating openings 501a and the second group of second insulating openings 502a comprises circular, elliptical, rectangular, polygonal, or arbitrary shapes. In the present embodiment, as shown in FIG. 5A, the first group of second insulating openings 501a is separated from each other and arranged in a plurality of rows, and the first group of second insulating openings 501a is corresponding to the multiple vias 100a and the first group of first insulating openings 203a. The second group of second insulating openings 502a is disposed close to one side of the substrate 11a, such as the left side or the right side of the substrate 11a. The second group of second insulating openings 502a is separated from each other and located between two adjacent rows of the first group of second insulating openings 501a. The second insulating layer 50a includes one layer or multiple layers. When the second insulating layer 50a includes one layer, the second insulating layer 50a protects the sidewalls of the semiconductor structure 1000a to prevent destruction of the active layer 103a by subsequent processes. When the second insulating layer 50a includes multiple layers, the second insulating layer 50a comprises two or more layers having different refractive index materials alternately stacked to form a Distributed Bragg reflector (DBR), which can selectively reflect light of a specific wavelength. The second insulating layer 50a is formed of a non-conductive material comprising organic material, such as Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, fluorocarbon polymer, or inorganic material, such as silicone, glass, or dielectric material, such as aluminum oxide ($Al_2O_3$), silicon nitride ($SiN_x$), silicon oxide ($SiO_x$), titanium oxide ($TiO_x$), or magnesium fluoride ($MgF_x$).

Figure 6A:
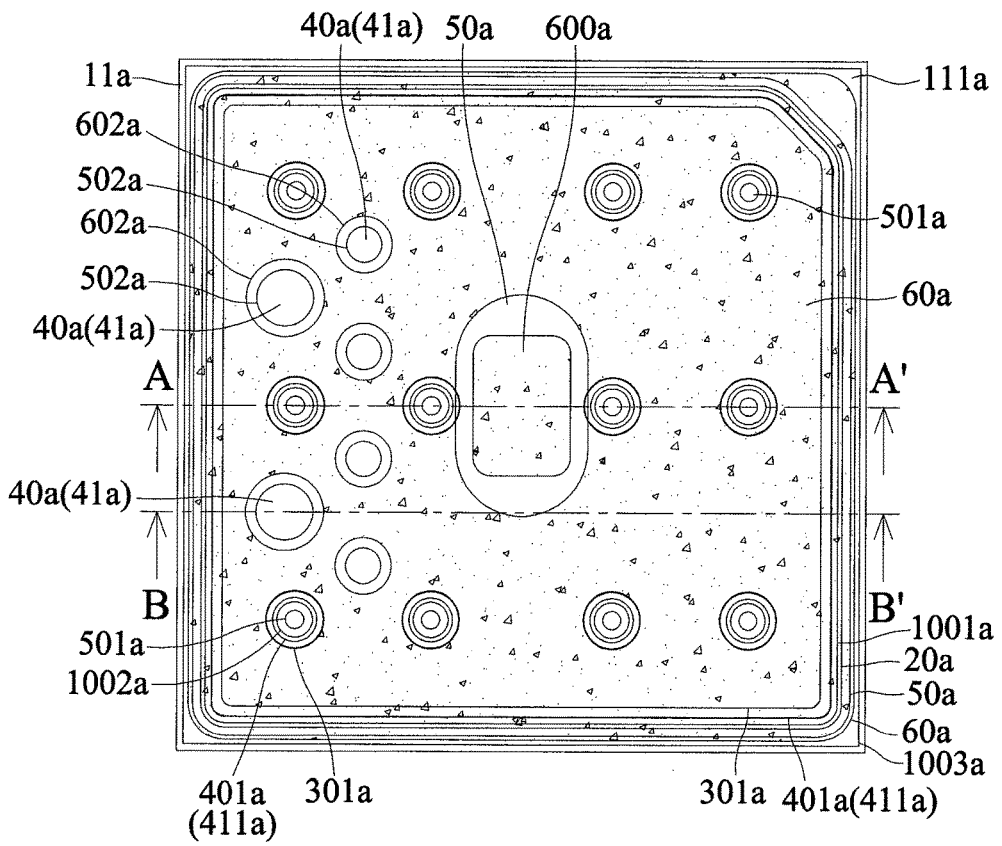
Figure 6B:
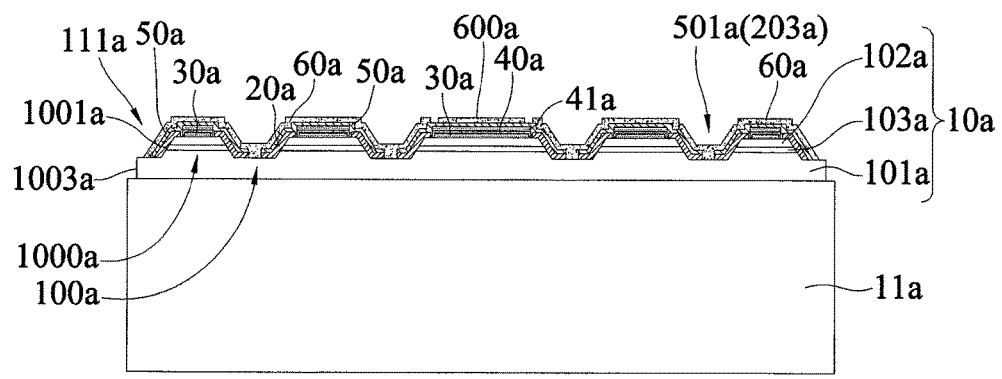
Figure 6C:
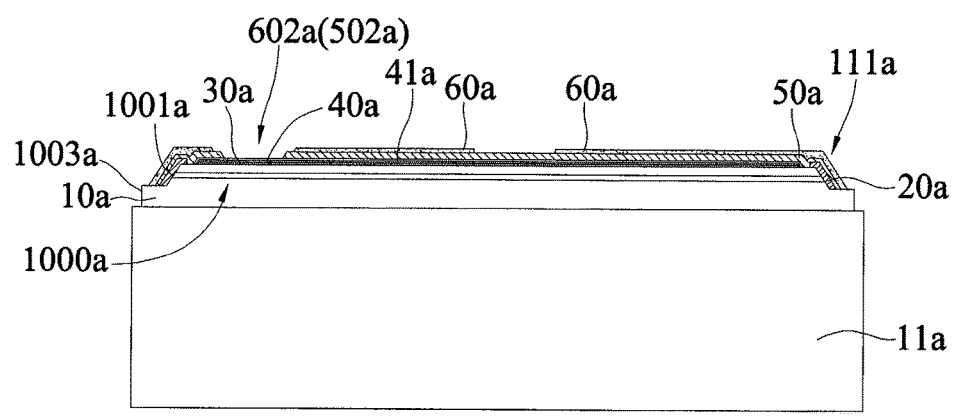

Following the step of forming the second insulating layer, as a top view in FIG. 6A, a cross-sectional view in FIG. 6B which is taken along line A-A' of FIG. 6A and a cross-sectional view in FIG. 6C which is taken along line B-B' of FIG. 6A show, the manufacturing method of the light-emitting device 1 or the light-emitting device 2 comprises a step of forming the contact layer. A contact layer 60a can be formed on the first semiconductor layer 101a and the second semiconductor layer 102a by sputter or vapor deposition, etc., and then patterned by lithography and etching to form one or more contact layer openings 602a on the second group of second insulating openings 502a to expose the reflective layer 40a or the barrier layer 41a, and define a pin region 600a at a geometric center in the top view of the light-emitting device 1 or the light-emitting device 2. In the cross-sectional view of the light-emitting device 1 or the light-emitting device 2, the contact layer opening 602a comprises a width larger than a width of any one of the second group of second insulating openings 502a. In the top view of the light-emitting device 1 or the light-emitting device 2, the multiple contact layer openings 602a are close to one side of the substrate 11a, for example, to the left side or the right side of the substrate 11a. The contact layer 60a includes one layer or multiple layers. In order to reduce the resistance in contact with the first semiconductor layer 101a, the material of the contact layer 60a comprises metal material such as chromium (Cr), titanium (Ti), tungsten (W), gold (Au), aluminum (Al), indium (In), tin (Sn), nickel (Ni), platinum (Pt), or an alloy of the above materials. In an embodiment of the present application, the material of the contact layer 60a comprises a metal material other than gold (Au), copper (Cu). In an embodiment of the present application, the material of the contact layer 60a comprises a metal having high reflectivity, such as aluminum (Al) or platinum (Pt). In an embodiment of the present application, one side of the contact layer 60a contacting with the first semiconductor layer 101a comprises chromium (Cr) or titanium (Ti) to increase the bonding strength with the first semiconductor layer 101a.

In an embodiment of the present application, the contact layer 60a covers all the vias 100a and extends over the second semiconductor layer 102a, wherein the contact layer 60a is insulated from the second semiconductor layer 102a by the second insulating layer 50a and contacts the first semiconductor layer 101a through the via 100a. When an external current is injected into the light-emitting device 1 or the light-emitting device 2, the current is conducted to the first semiconductor layer 101a by the multiple vias 100a. In the present embodiment, two adjacent vias 100a located on the same row comprise a first shortest distance there between, any via 100a adjacent to the edge of the light-emitting device and the first outside wall 1003a of the first semiconductor layer 101a comprises a second shortest distance there between, wherein the first shortest distance is greater than the second shortest distance.

In another embodiment of the present application, the contact layer 60a covers the surrounding part 111a and the via 100a, and extends over the second semiconductor layer 102a, wherein the contact layer 60a is insulated from the second semiconductor layer 102a by the second insulating layer 50a, and the contact layer 60a contacts the first semiconductor layer 101a by the surrounding part 111a and the via 100a. When an external current is injected into the light-emitting device 1 or the light-emitting device 2, one part of the current is conducted to the first semiconductor layer 101a by the surrounding part 111a and other part is conducted to the first semiconductor layer 101a through the multiple vias 100a. In the present embodiment, two adjacent vias 100a located on the same row comprise a first shortest distance there between. Any via 100a adjacent to the edge of the light-emitting device and the first outside wall 1003a of the first semiconductor layer 101a comprises a second shortest distance there between, wherein the first shortest distance is smaller than or equal to the second shortest distance.

In another embodiment of the present application, the multiple vias 100a can be arranged in a first row and a second row. A first shortest distance is between two adjacent vias 100a in the same row and a second shortest distance is between the via 100a located in the first row and the via 100a in the second row, wherein the first shortest distance is greater than or smaller than the second shortest distance.

In an embodiment of the present application, the multiple vias 100a can be arranged in a first row, a second row and a third row. A first shortest distance is between the via 100a in the first row and the via 100a in the second row and a second shortest distance is between the via 100a in the second row and the via 100a in the third row, where the first shortest distance is smaller than the second shortest distance.

Figure 7A:
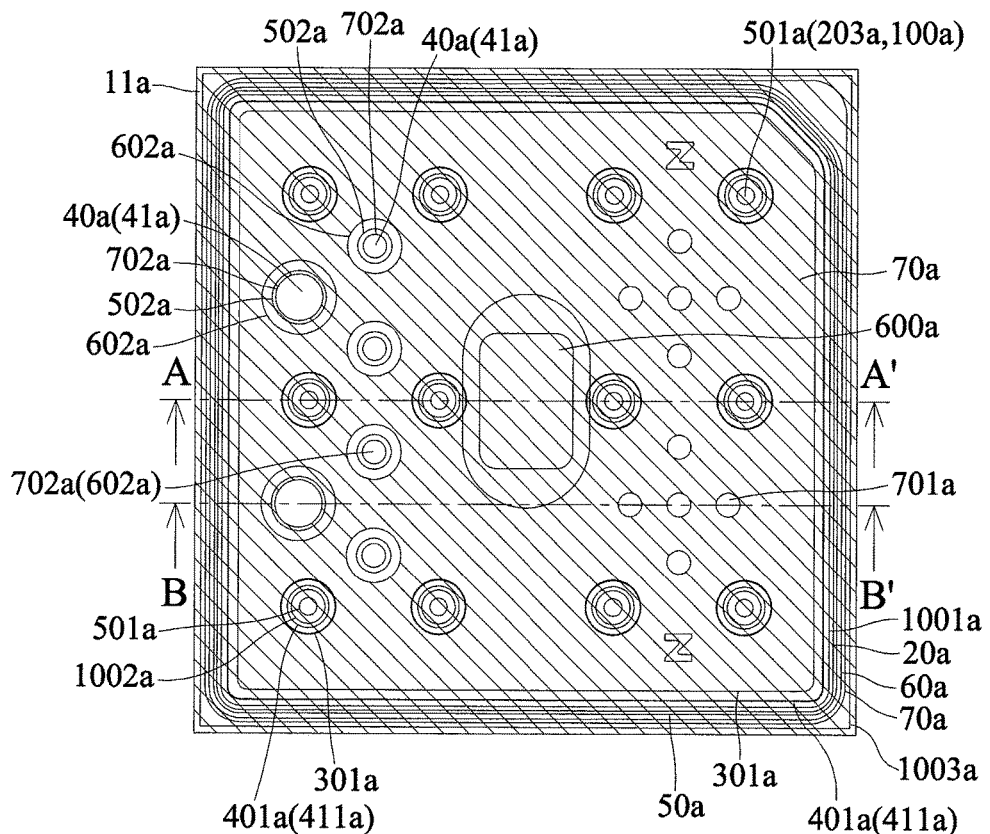
Figure 7B:
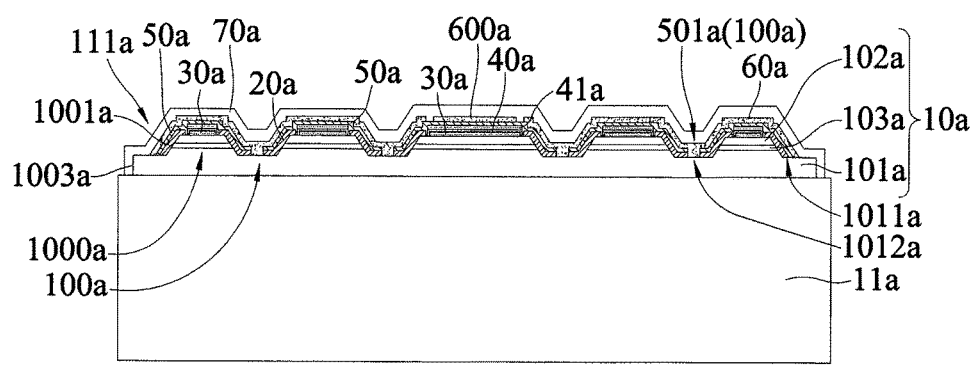
Figure 7C:
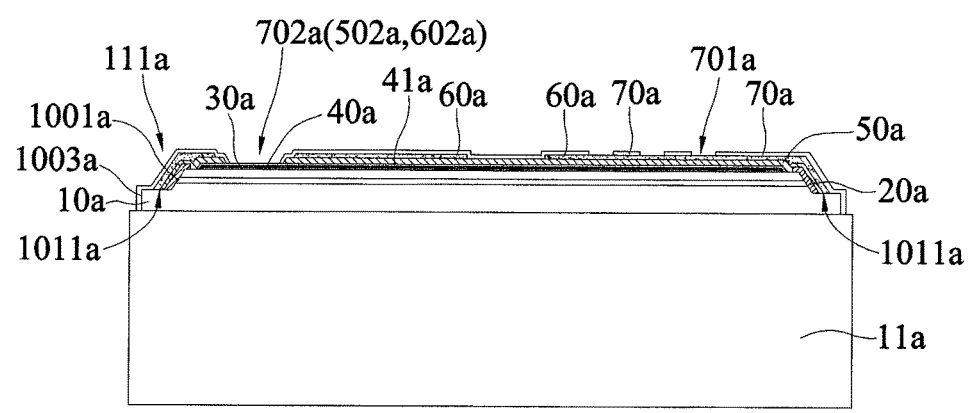

In an embodiment of the present application, following the step of forming the contact layer, the manufacturing method of the light-emitting device 1 or the light-emitting device 2 comprises a step of forming a third insulating layer. As a top view in FIG. 7A, a cross-sectional view in FIG. 7B which is taken along line A-A' of FIG. 7A, and a cross-sectional view in FIG. 7C which is taken along line B-B' of FIG. 7A show, a third insulating layer 70a can be formed on the semiconductor structure 1000a by sputter or vapor deposition, etc., and then patterned by lithography and etching to form a first group of third insulating openings 701a on the contact layer 60a to expose the contact layer 60a shown in FIG. 6A and form a second group of third insulating openings 702a on the one or more contact layer openings 602a to expose the reflective layer 40a or the barrier layer 41a shown in FIG. 6A, wherein the contact layer 60a on the second semiconductor layer 102a is interposed between the second insulating layer 50a and the third insulating layer 70a, the first group of third insulating openings 701a, and the first group of second insulating openings 501a are offset from each other and do not overlap each other. The pin region 600a is surrounded and covered by the third insulating layer 70a. In the present embodiment, as shown in FIG. 7A, the first group of third insulating openings 701a is separated from each other and is offset from the multiple vias 100a. The second group of third insulating openings 702a is separated from each other and respectively corresponding to the multiple contact layer openings 602a. As shown in the top view of FIG. 7A, the first group of third insulating openings 701a is close to one side of the substrate 11a, for example, the right side, and the second group of third insulating openings 702a is close to another side of the substrate 11a, for example, the left side of the substrate 11a. In the cross-sectional view of the light-emitting device 1 or the light-emitting device 2, any of the second group of third insulating openings 702a comprises a width smaller than the width of any of the contact layer openings 602a, the third insulating layer 70a is filled to cover the sidewall of the contact layer opening 602a along the contact layer opening 602a, and exposes the reflective layer 40a or the barrier layer 41a to form the second group of third insulating openings 702a. The third insulating layer 70a includes one layer or multiple layers. When the third insulating layer 70a includes multiple layers, the third insulating layer 70a includes two or more layers having different refractive index alternately stacked to form a Distributed Bragg reflector (DBR), which can selectively reflects light of a specific wavelength. The third insulating layer 70a is formed of a non-conductive material comprising organic material, such as Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, fluorocarbon polymer, or inorganic material, such as silicone, glass, or dielectric material, such as aluminum oxide ($Al_2O_3$), silicon nitride ($SiN_x$), silicon oxide ($SiO_x$), titanium oxide ($TiO_x$), or magnesium fluoride ($MgF_x$).

Figure 8:
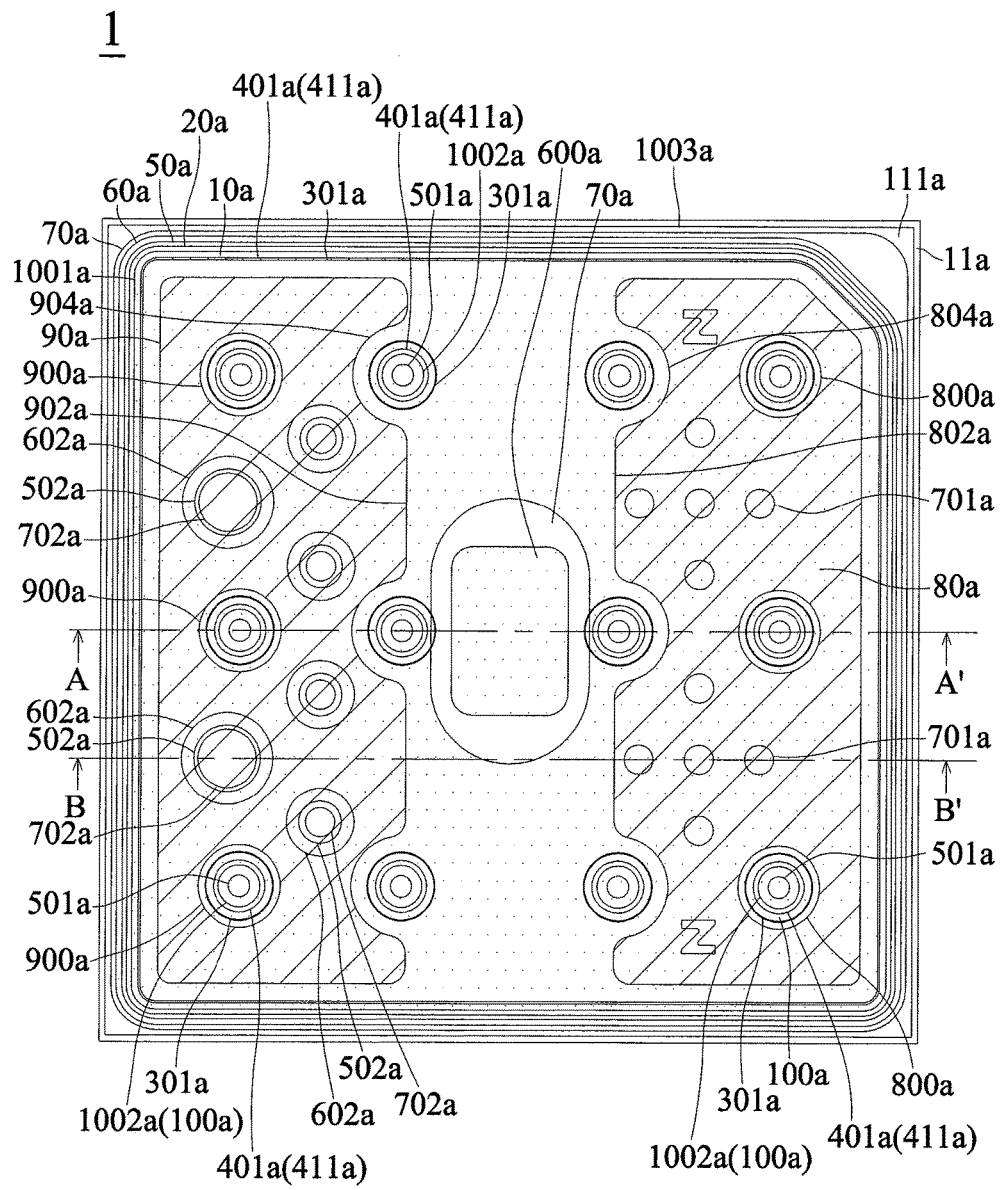
FIG. 8 illustrates a top view of the light-emitting device 1 in accordance with an embodiment of the present application.

Following the step of forming the third insulating layer, the manufacturing method of the light-emitting device 1 or the light-emitting device 2 comprises a step of forming a pad. As shown in the top view of FIG. 8, a first pad 80a and a second pad 90a can be formed on the one or more semiconductor structures 1000a by plating, sputter or vapor deposition, and then patterned by lithography and etching. As the top view in FIG. 8 shows, the first pad 80a is adjacent to one side of the substrate 11a, for example, the right side, and the second pad 90a is adjacent to another side of the substrate 11a, for example, the left side. The first pad 80a covers all of the first group of third insulating openings 701a to contact the contact layer 60a, and is electrically connected to the first semiconductor layer 101a through the contact layer 60a and the via 100a. The second pad 90a covers all the second group of third insulating openings 702a to contact the reflective layer 40a or the barrier layer 41a, and is electrically connected to the second semiconductor layer 102a through the reflective layer 40a or the barrier layer 41a. The first pad 80a comprises one or more first pad openings 800a, and a first side 802a and a plurality of first recesses 804a extending from the first side 802a in a direction away from the second pad 90a. The second pad 90a comprises one or more second pad openings 900a, and a second side 902a and a plurality of second recesses 904a extending from the second side 902a in a direction away from the first pad 80a. The positions of the first pad opening 800a and the position of the second pad opening 900a are substantially corresponding to the positions of the vias 100a, and the positions of the first recess 804a and the position of the second recess 904a are substantially corresponding to the positions of the vias 100a. In other words, the first pad 80a and the second pad 90a do not cover any via 100a. The first pad 80a and the second pad 90a are formed to surround the via 100a and are formed around the via 100a. The first pad opening 800a or the second pad opening 900a comprises a diameter larger than that of any via 100a and the first recess 804a or the second recess 904a comprises a width larger than the diameter of any via 100a. In an embodiment of the present application, a plurality of first recesses 804a is substantially aligned to a plurality of second recesses 904a in a top view of the light-emitting device. In another embodiment of the present application, the plurality of first recesses 804a is offset from the plurality of second recesses 904a in the top view. In an embodiment of the present application, a shape of the first pad 80a is same as or different from a shape of the second pad 90a in the top view of the light-emitting device 1 or the light-emitting device 2.

Figure 9A:
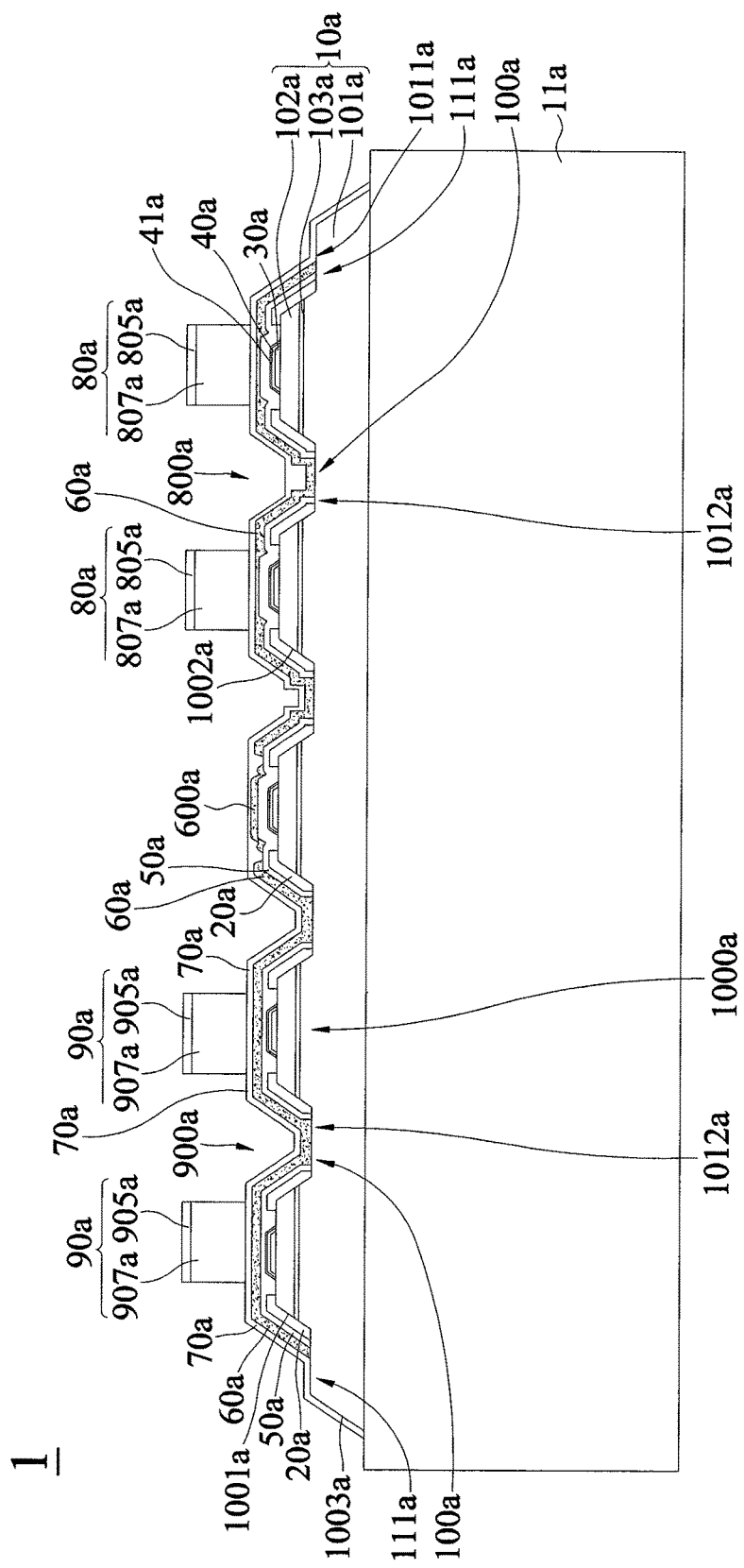
FIG. 9A illustrates a cross-sectional view of the light-emitting device 1 in accordance with an embodiment of the present application.
Figure 9B:
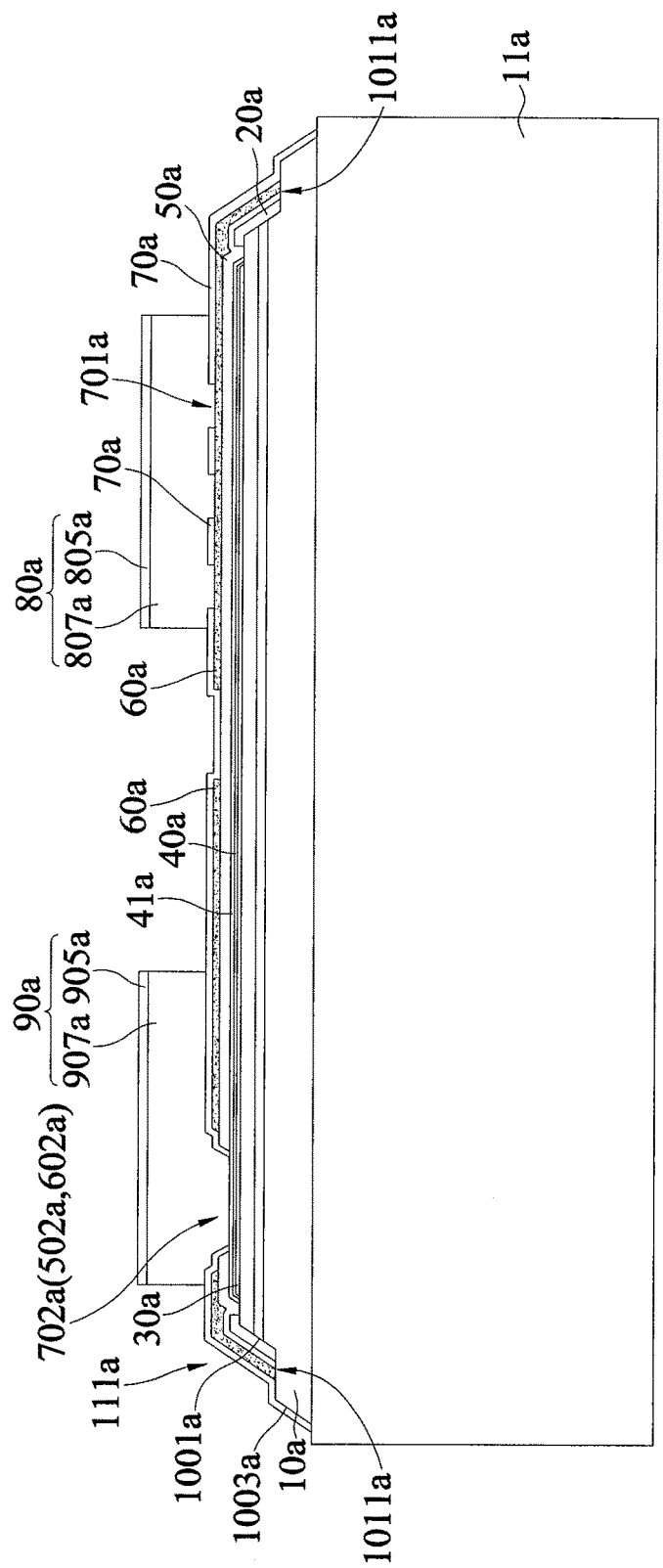
FIG. 9B illustrates a cross-sectional view of the light-emitting device 1 in accordance with an embodiment of the present application.

FIG. 9A is a cross-sectional view taken along line A-A' of FIG. 8, and FIG. 9B is a cross-sectional view taken along line B-B' of FIG. 8. The light-emitting device 1 disclosed in the present embodiment is a flip chip type of light-emitting diode. The light-emitting device 1 comprises a substrate 11a; one or more semiconductor structures 1000a on the substrate 11a; a surrounding part 111a surrounding one or more semiconductor structures 1000a; and a first pad 80a and a second pad 90a formed on one or more semiconductor structures 1000a. Each of the one or more semiconductor structures 1000a comprises a semiconductor stack 10a comprising a first semiconductor layer 101a, a second semiconductor layer 102a, and an active layer 103a between the first semiconductor layer 101a and the second semiconductor layer 102a. The multiple semiconductor structures 1000a are connected to each other by the first semiconductor layer 101a. As shown in FIG. 8, FIG. 9A, and FIG. 9B, the second semiconductor layer 102a and the active layer 103a around the one or more semiconductor structures 1000a are removed to expose the first surface 1011a of the first semiconductor layer 101a. In other words, the surrounding part 111a comprises a first surface 1011a of the first semiconductor layer 101a to surround the semiconductor structure 1000a.

The light-emitting device 1 further comprises one or more vias 100a passing through the second semiconductor layer 102a and the active layer 103a to expose one or more second surfaces 1012a of the first semiconductor layer 101a, and a contact layer 60a formed on the first surface 1011a of the first semiconductor layer 101a to surround the semiconductor structure 1000a and contact the first semiconductor layer 101a to form an electrical connection. The contact layer 60a is formed on the one or more second surfaces 1012a of the first semiconductor layer 101a to cover the one or multiple vias 100a and contact the first semiconductor layer 101a to form an electrical connection. In the present embodiment, as the top view of the light-emitting device 1 shows, the contact layer 60a comprises a total surface area larger than a total surface area of the active layer 103a, or the contact layer 60a comprises a peripheral length larger than a peripheral length of the active layer 103a.

In an embodiment of the present application, the first pad 80a and/or the second pad 90a cover the multiple semiconductor structures 1000a.

In an embodiment of the present application, the first pad 80a comprises one or more first pad openings 800a and the second pad 90a comprises one or more second pad openings 900a. The first pad 80a and the second pad 90a are formed at positions other than a position of the via 100a, and the positions of the first pad opening 800a, the second pad opening 900a, and the via 100a are overlapping each other.

In an embodiment of the present application, as the top view of the light-emitting device 1 shows, the first pad 80a comprises the same shape as that of the second pad 90a, for example, the first pad 80a and the second pad 90a comprise comb shape As shown in FIG. 8, a curvature radius of the first pad opening 800a of the first pad 80a and a curvature radius of the first recess 804a are respectively larger than a curvature radius of the via 100a, and the first pad 80a is formed at a region other than the positions of the multiple vias 100a. A curvature radius of the second pad opening 900a of the second pad 90a and a curvature radius of the second recess 904a are respectively larger than the curvature radius of the via 100a, and the second pad 90a is formed at a region other than the position of the multiple vias 100a.

In one embodiment of the present application, as the top view of the light-emitting device 1 shows, the shape of the first pad 80a is different from the shape of the second pad 90a. For example, when the shape of the first pad 80a is rectangular, the shape of the second pad 90a is comb-shaped. The first pad 80a comprises a first pad opening 800a and the first pad 80a is formed in a region other than the multiple vias 100a. The second pad 90a comprises the second recess 904a and/or the second pad opening 900a and the second pad 90a is formed at a region other than the multiple vias 100a.

In an embodiment of the present application, the size of the first pad 80a is different from the size of the second pad 90a, for example, the area of the first pad 80a is larger than that of the second pad 90a. The first pad 80a and the second pad 90a include one layer or multiple layers composed of metal material. The materials of the first pad 80a and the second pad 90a comprise metal materials, such as chromium (Cr), titanium (Ti), tungsten (W), aluminum (Al), indium (In), tin (Sn), nickle (Ni), platinum (Pt), or an alloy of the above materials. When the first pad 80a and the second pad 90a include multiple layers, the first pad 80a comprises a first upper pad 805a and a first lower pad 807a, and the second pad 90a comprises a second upper pad 905a and a second lower pad 907a. The upper pad and the lower pad have different functions. The function of the upper pad is used for soldering and wiring. The light-emitting device 1 can be flipped and mounted onto the package substrate by using solder bonding or AuSn eutectic bonding through the upper pad. The metal material of the upper pad comprises highly ductile materials such as nickel (Ni), cobalt (Co), iron (Fe), titanium (Ti), copper (Cu), gold (Au), tungsten (W), zirconium (Zr), molybdenum (Mo), tantalum (Ta), aluminum (Al), silver (Ag), platinum (Pt), palladium (Pd), rhodium (Rh), iridium (Ir), ruthenium (Ru), osmium (Os), or an alloy of the above materials. The upper pad includes one layer or multiple layers. In an embodiment of the present application, the material of the upper pad comprises nickel (Ni) or gold (Au), and the upper pad includes one layer or multiple layers. The function of the lower pad is for forming a stable interface with the contact layer 60a, the reflective layer 40a, or the barrier layer 41a. For example, the lower pad improves the interface bonding strength between the first lower pad 807a and the contact layer 60a, or enhances the interface bonding strength between the second lower pad 907a and the reflective layer 40a or between the second lower pad 907a and the barrier layer 41a. Another function of the lower pad is to prevent tin (Sn) in the solder or AuSn from diffusing into the reflective structure that damages the reflectivity of the reflective structure. Therefore, the lower pad comprises a metal material other than gold (Au) and copper (Cu), such as nickel (Ni), cobalt (Co), iron (Fe), titanium (Ti), tungsten (W), zirconium (Zr), molybdenum (Mo), tantalum (Ta), aluminum (Al), silver (Ag), platinum (Pt), palladium (Pd), rhodium (Rh), iridium (Ir), ruthenium (Ru), osmium (Os), or an alloy of the above materials, the lower pad includes one layer or multiple layers. In an embodiment of the present application, the lower pad comprises multiple layers composed of titanium (Ti) and aluminum (Al), or multiple layers composed of chromium (Cr) and aluminum (Al).

In an embodiment of the present application, viewing from a cross-sectional aspect of the light-emitting device 1, a portion of the contact layer 60a connected to the first semiconductor layer 101a is formed under the second pad 90a.

In an embodiment of the present application, viewing from a cross-sectional aspect of the light-emitting device 1, a portion of the contact layer 60a connected to the first semiconductor layer 101a is formed above the reflective layer 40a and/or the barrier layer 41a.

In an embodiment of the present application, as a top view of the light-emitting device 1 shows, the via 100a comprises a maximum width smaller than a maximum width of the first pad opening 800a; and/or the via 100a comprises a maximum width smaller than a maximum width of the second pad opening 900a.

In an embodiment of the present application, as a top view of the light-emitting device 1 shows, the multiple vias 100a are respectively formed in the plurality of first recesses 804a of the first pad 80a and the plurality of second recesses 904a of the second pad 90a.

Figure 10:
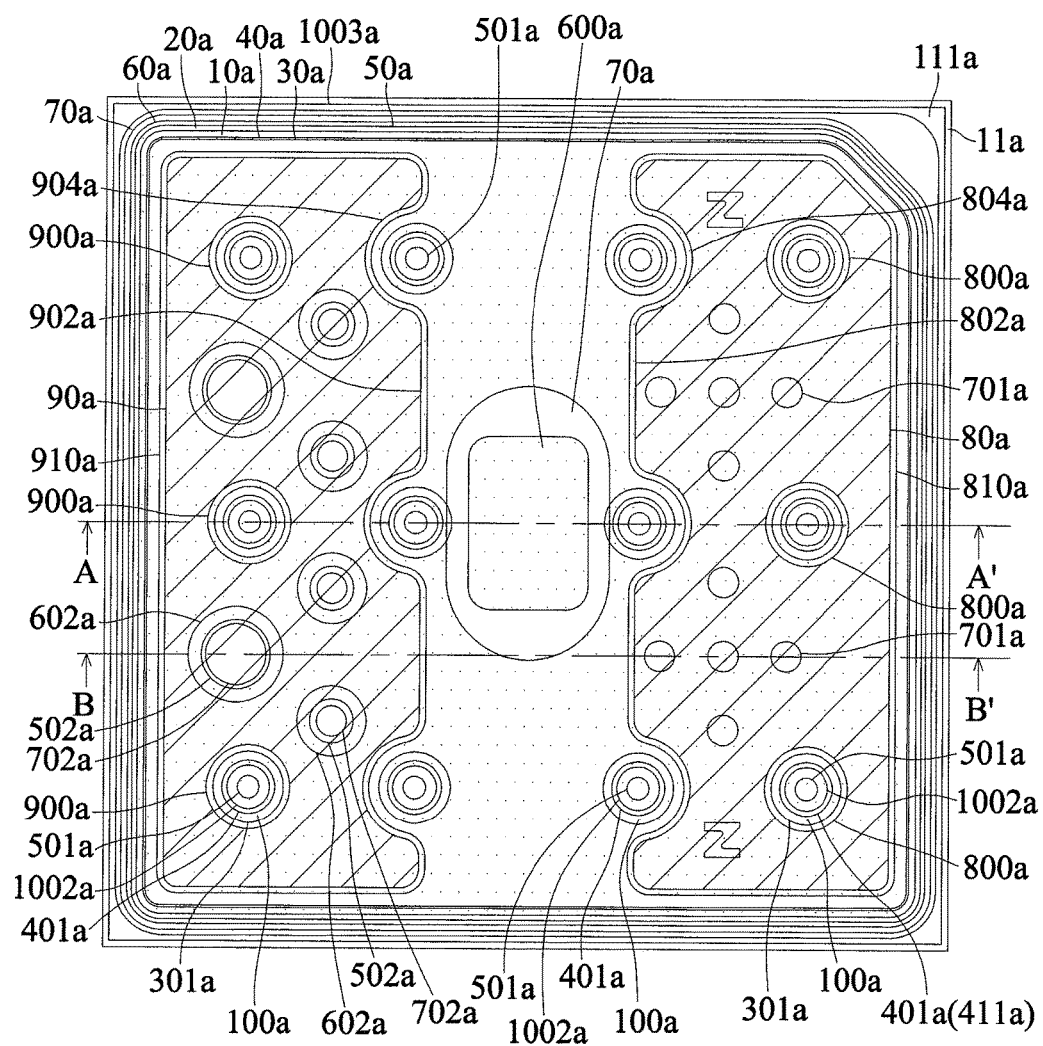
FIG. 10 illustrates a top view of the light-emitting device 2 in accordance with an embodiment of the present application.

FIG. 10 is a cross-sectional view of a light-emitting device 2 according to an embodiment of the present application. As compared with the light-emitting device 1 in the above-described embodiment, the light-emitting device 2 further comprises a first buffer pad 810a and a second buffer pad 910a respectively under the first pad 80a and the second pad 90a. The light-emitting device 2 comprises the same structure as that of the light-emitting device 1, and therefore, the structure named by same terms or labelled by same numbers of the light-emitting device 1 in FIG. 9 and the light-emitting device 2 in FIG. 10 have the same structure, materials, or have the same function, which will be omitted in this embodiment or not repeat them in the following description. In the embodiment, the light-emitting device 2 comprises a first buffer pad 810a formed between the first pad 80a and the semiconductor stack 10a and a second buffer pad 910a formed between the second pad 90a and the semiconductor stack 10a, wherein the first buffer pad 810a and the second buffer pad 910a cover part or all of the vias 100a. In the embodiment, when multiple insulating layers are formed between the pads 80a, 90a and the semiconductor stack 10a, the stress is formed during the boning of the pads 80a and 90a of the light-emitting device 2 and the solder or AuSn eutectic, which causes cracks between the pads 80a, 90a and the insulating layer. The buffer pads 810a, 910a are respectively formed between the pads 80a, 90a and the third insulating layer 70a, and the first buffer pad 810a and the second buffer pad 910a cover all the vias 100a. The first pad 80a and the second pad 90a are formed in positions other than the positions of the vias 100a. In other words, the first pad 80a and the second pad 90a do not cover the via 100a. The material of the buffer pad is selected and the thickness of the pad is reduced to reduce the stress generated between the pad and the insulating layer.

In another embodiment of the present application, as shown in FIG. 10, from the top view of the light-emitting device 2, the shapes of the buffer pads 810a, 910a are respectively the same as those of the pads 80a, 90a. For example, the first buffer pad 810a and the first pad 80a are comb-shaped.

In an embodiment of the present application, from the top view of the light-emitting device 2 (nor shown), the shapes of the buffer pads 810a, 910a are different from those of the pads 80a, 90a. For example, the shape of the first buffer pad 810a is rectangular and the shape of the first pad 80a is comb.

In another embodiment of the present application, the sizes of the buffer pads 810a, 910a are respectively different from those of the pads 80a, 90a. For example, the area of the first buffer pad 810a is larger than the area of the first pad 80a and the area of the second buffer pad 910a is larger than that of the second pad 90a.

In another embodiment of the present application, a distance between the first pad 80a and the second pad 90a is larger than a distance between the first buffer pad 810a and the second buffer pad 910a.

In another embodiment of the present application, the buffer pads 810a, 910a comprise a larger area than that of the pads 80a, 90a to release the stress of the pads 80a, 90a during the bonding. In a cross-sectional view of the light-emitting device 2, the first buffer pad 810a comprises a width 1.5 to 2.5 times, preferably 2 times the width of the first pad 80a.

In another embodiment of the present application, the buffer pads 810a, 910a respectively comprises an area larger than that of the pads 80a, 90a to release the stress of the pads 80a, 90a during the bonding. In a cross-sectional view of the light-emitting device 2, the first buffer pad 810a comprises a distance extending outside an edge of the first pad 80a, which is more than one times the thickness of the first buffer pad 810a, preferably more than two times the thickness of the first buffer pad 810a.

In another embodiment of the present application, the pads 80a, 90a comprise a thickness between 1 μm and 100 μm, preferably between 2 μm and 6 μm. Each of the buffer pads 810a, 910a comprises a thickness larger than 0.5 μm to release the stress of the bond pads 80a, 90a during bonding.

In another embodiment of the present application, each of the first buffer pad 810a and the second buffer pad 910a includes one layer or multiple layers composed of a metal material. The first buffer 810a and the second buffer 910a function as a stable interface with the contact layer 60a, the reflective layer 40a, or the barrier layer 41a. For example, the first buffer pad 810a contacts the contact layer 60a, and the second buffer pad 910a contacts the reflective layer 40a or the barrier layer 41a. The buffer pads 810a, 910a comprise metal materials other than gold (Au) and copper (Cu), such as chromium (Cr), nickel (Ni), cobalt (Co), iron (Fe), titanium (Ti), tungsten(W), zirconium (Zr), molybdenum (Mo), tantalum (Ta), aluminum (Al), silver (Ag), platinum (Pt), palladium (Pd), rhodium (Rh), iridium (Ir), ruthenium (Ru) or osmium (Os) to prevent tin (Sn) in the solder or AuSn eutectic from diffusing into the light-emitting device.

In another embodiment of the present application, the first buffer pad 810a and/or the second buffer pad 910a includes multiple layers composed of metal materials, wherein the multiple layers comprises a high ductility layer and a low ductility layer to prevent the stress formed in the bonding between the pads 80a, 90a and the solder or AuSn from causing cracks in the insulating layer between the pads 80a, 90a and the semiconductor stack 10a. The high ductility layer and the low ductility layer comprise metals having different Young's modulus.

In another embodiment of the present application, the high ductility layers of the first buffer pad 810a and the second buffer pad 910a comprise a thickness larger than or equal to a thickness of the low ductility layers of the first buffer pad 810a and the second buffer pad 910a.

In another embodiment of the present application, the first buffer pad 810a and the second buffer pad 910a comprise multiple layers composed of a metal material. When the first buffer pad 80a and the second buffer pad 90a comprise multiple layers composed of metal material, one side of the first buffer pad 810a and one side of the first pad 80a contacting each other comprise same metal material, one side of the second buffer pad 910a and one side of the second pad 90a contacting each other comprise same metal material, such as chromium (Cr), nickel (Ni), titanium (Ti), or platinum (Pt) to improve the interface bonding strength between the pad and the buffer pad.

Figure 11A:
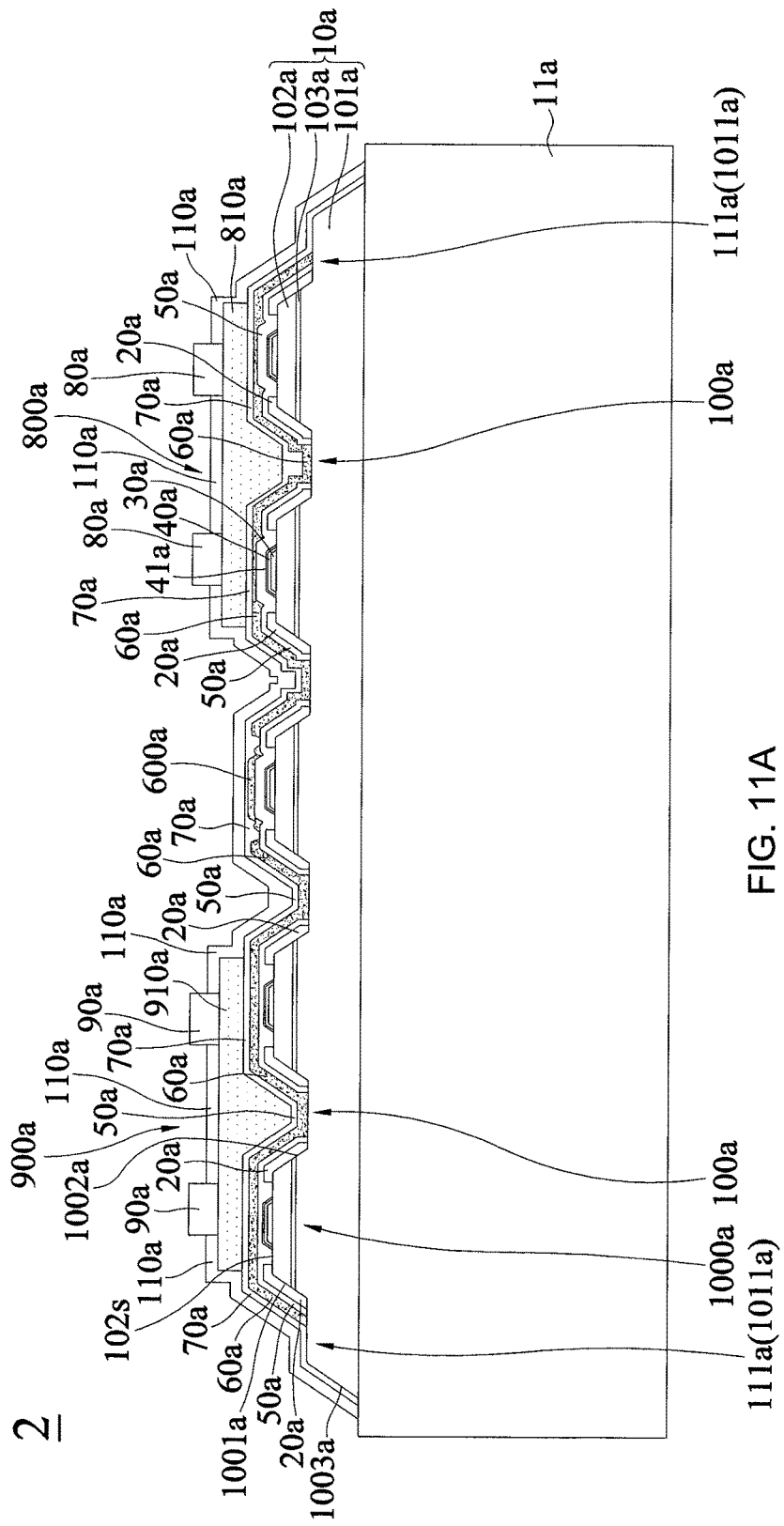
FIG. 11A illustrates a cross-sectional view of the light-emitting device 2 in accordance with an embodiment of the present application.
Figure 11B:
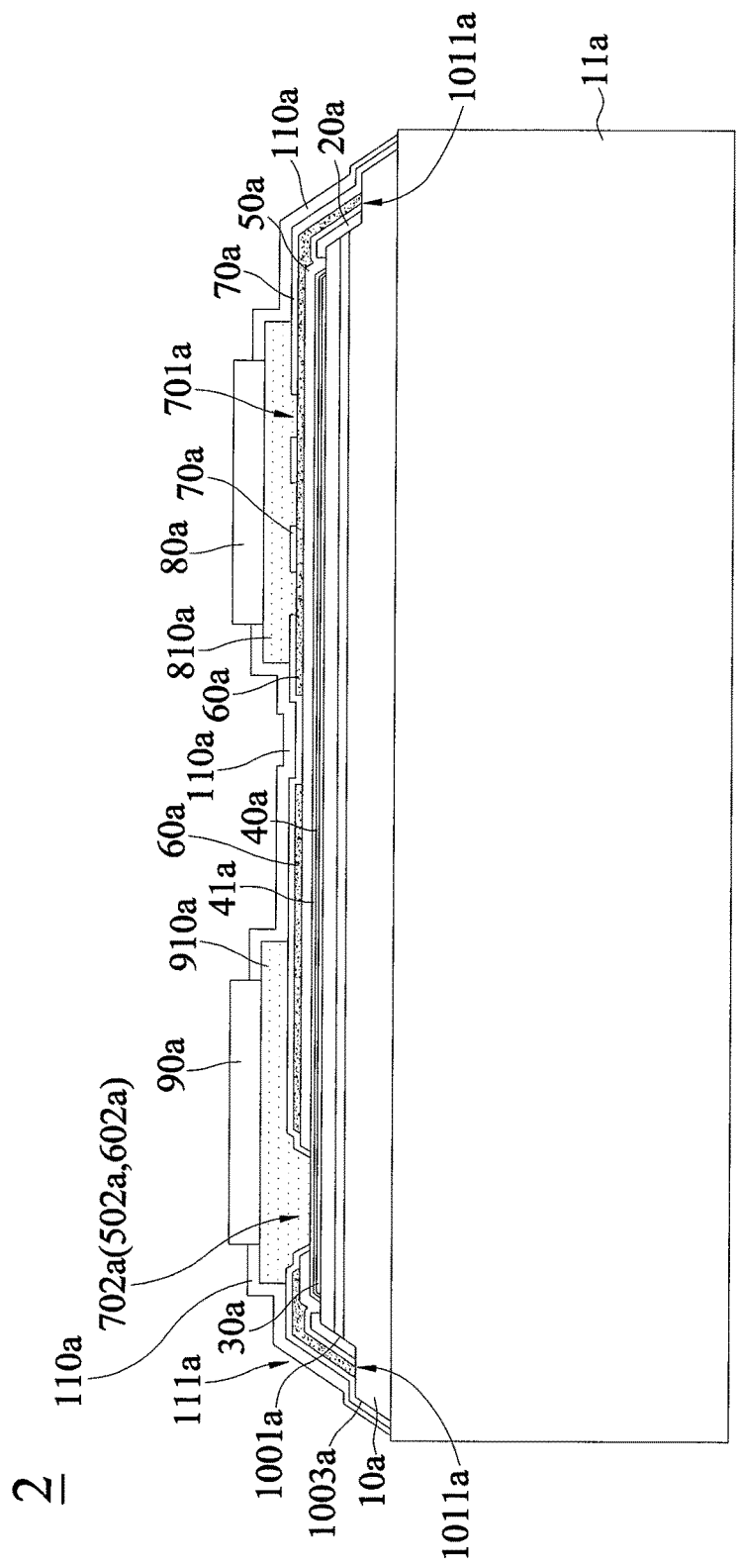
FIG. 11B illustrates a cross-sectional view of the light-emitting device 2 in accordance with an embodiment of the present application.

As shown in FIG. 11A and FIG. 11B, a fourth insulating layer 110a can be formed on the first buffer pad 810a and the second buffer pad 910a by sputter or vapor deposition and patterned by lithography and etching. The first pad 80a and the second pad 90a are respectively formed on the first buffer pad 810a and the second buffer pad 910a by the above described method, wherein the fourth insulating layer 110a surrounds sidewalls of the first buffer pad 810a and the second buffer pad 910a. The fourth insulating layer 110a includes one layer or multiple layers. When the fourth insulating layer 110a includes multiple layers, the fourth insulating layer 110a comprises two or more layers having different refractive indexes alternately stacked to form a Distributed Bragg reflector (DBR) which can selectively reflect light of a specific wavelength. The material of the fourth insulating layer 110a comprises nonconductive material comprising organic materials, such as Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, fluorocarbon polymer, or inorganic material, such as silicone, glass, or dielectric material, such as aluminum oxide ($Al_2O_3$), silicon nitride ($SiN_x$), silicon oxide ($SiO_x$), titanium oxide ($TiO_x$), or magnesium fluoride ($MgF_x$).

In an embodiment of the present application, the manufacturing process of the first pad 80a and the second pad 90a directly follows the manufacturing process of the first buffer pad 810a and the second buffer pad 910a. In another embodiment of the present application, after the manufacturing process of the first buffer pad 810a and the second buffer pad 910a, the step of forming the fourth insulating layer 110a is performed first and the manufacturing process of the first pad 80a and the second pad 90a follows the fourth insulating layer 110a.

FIGS. 12A-22 illustrate a manufacturing method of a light-emitting device 3 or a light-emitting device 4 in accordance with embodiments of the present application.

Figure 12A:
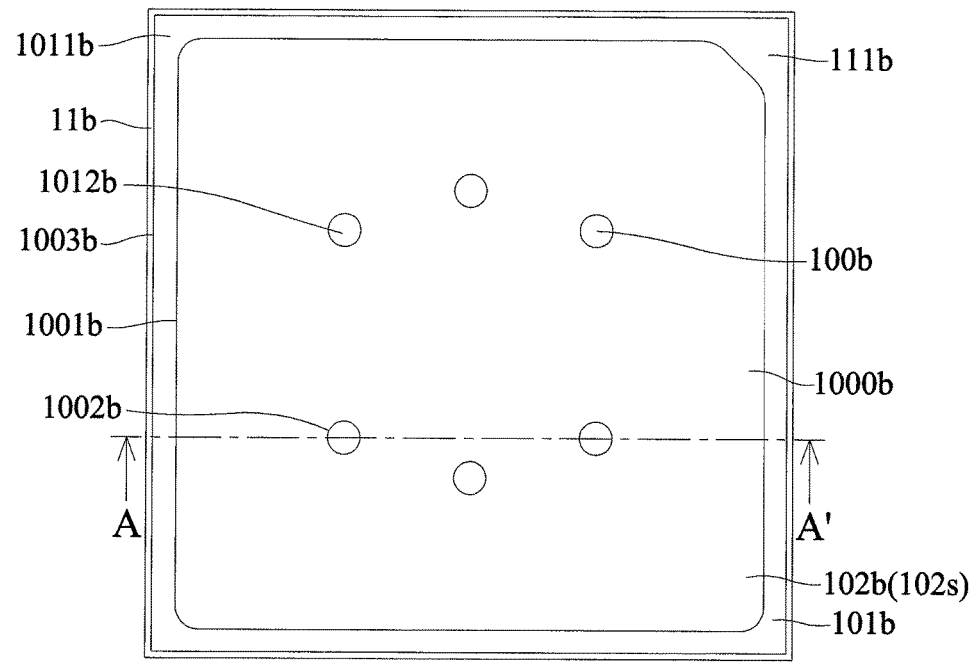
FIGS. 12A-18B illustrate a manufacturing method of a light-emitting device 3 or a light-emitting device 4 in accordance with embodiments of the present application.
Figure 12B:
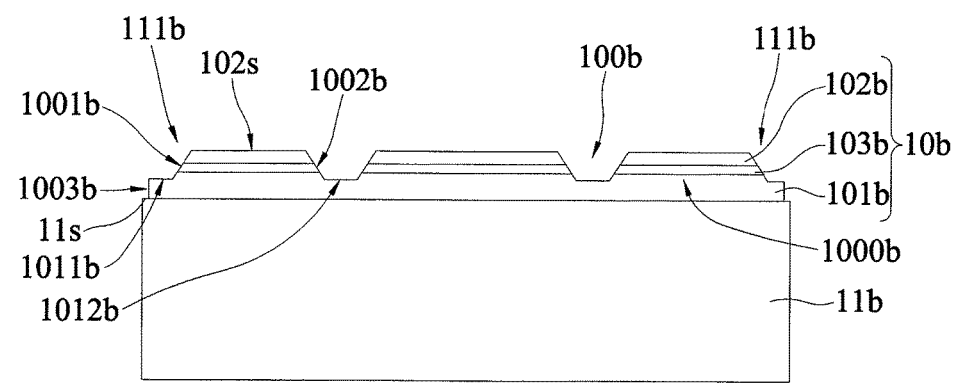

As shown in a top view of FIG. 12A and a cross-sectional view of FIG. 12B which is taken along line A-A' of FIG. 12A, a manufacturing method of a light-emitting device 3 or a light-emitting device 4 comprises a step of forming a mesa, which includes providing a substrate 11b and forming a semiconductor stack 10b on the substrate 11b, wherein the semiconductor stack 10b comprises a first semiconductor layer 101b, a second semiconductor layer 102b, and an active layer 103b between the first semiconductor layer 101a and the second semiconductor layer 102a. The semiconductor stack 10b can be patterned by lithography and etching to remove a portion of the second semiconductor layer 102b and the active layer 103b to form one or multiple semiconductor structures 1000b, and form a surrounding part 111b surrounding the one or multiple semiconductor structures 1000b. The surrounding part 111b exposes a first surface 1011b of the first semiconductor layer 101b. The one or multiple semiconductor structures 1000b comprises a first outside wall 1003b, a second outside wall 1001b, and an inside wall 1002b, wherein the first outside wall 1003b is a sidewall of the first semiconductor layer 101b, the second outside wall 1001b is a sidewall of the active layer 103b and/or a sidewall of the second semiconductor layer 102b. One end of the second outside wall 1001b is connected to a surface 102s of the second semiconductor layer 102b and another end of the second outside wall 1001b is connected to the first surface 1011b of the first semiconductor layer 101b. One end of the inside wall 1002b is connected to the surface 102s of the second semiconductor layer 102b and another end of the inside wall 1002b is connected to a second surface 1012b of the first semiconductor layer 101b. The multiple semiconductor structures 1000b are connected to each other through the first semiconductor layer 101b. As shown in FIG. 12B, an obtuse angle is formed between the inside wall 1002b of the semiconductor structure 1000b and the second surface 1012b of the first semiconductor layer 101b. An obtuse angle or a right angle is formed between the first outside wall 1003b of the semiconductor structure 1000b and a surface 11s of the substrate 11b. An obtuse angle is formed between the second outside wall 1001b of the semiconductor structure 1000a and the first surface 1011b of the first semiconductor layer 101b. The surrounding part 111b surrounds the semiconductor structure 1000b and the top view of the surrounding part 111b is a rectangular or a polygonal shape.

In an embodiment of the present application, the light-emitting device 3 or the light-emitting device 4 comprises a side less than 30 mil. When an external current is injected into the light-emitting device 3 or the light-emitting device 4, the surrounding part 111b surrounds the semiconductor structure 1000b to distribute the light field of the light-emitting device 3 or the light-emitting device 4 uniformly and reduce the forward voltage of the light-emitting device.

In an embodiment of the present application, the light-emitting device 3 or the light-emitting device 4 comprises a side larger than 30 mil. The semiconductor stack 10b can be patterned by lithography and etching to remove a portion of the second semiconductor layer 102b and the active layer 103b to form one or multiple vias 100a penetrating through the second semiconductor layer 102b and the active layer 103b, wherein the one or multiple vias 100a expose one or more second surface 1012b of the first semiconductor layer 101b. When an external current is injected into the light-emitting device 3 or the light-emitting device 4, the surrounding part 111a and the multiple vias 100b are dispersedly disposed to distribute the light field of the light-emitting device 3 or the light-emitting device 4 uniformly and reduce the forward voltage of the light-emitting device.

In an embodiment of the present application, the one or multiple vias 100b comprises an opening having a shape, such as circular, ellipsoidal, rectangular, polygonal, or any shape. The multiple vias 100b are arranged into a plurality of rows and the vias 100b of adjacent two rows can be aligned with each other or staggered.

In an embodiment of the present application, the substrate 11b can be a growth substrate, for example, a gallium arsenide (GaAs) wafer for growing aluminum gallium indium phosphide (AlGaInP) or a sapphire ($Al_2O_3$) wafer, gallium nitride (GaN) wafer, or silicon carbide (SiC) wafer for growing indium gallium nitride (InGaN). The semiconductor stack 10b comprises optical characteristics, such as light-emitting angle or wavelength distribution, and electrical characteristics, such as forward voltage or reverse current. The semiconductor stack 10a can be formed on the substrate 11b by organic metal chemical vapor deposition (MOCVD), molecular beam epitaxy (MBE), hydride vapor deposition (HVPE), or ion plating.

In an embodiment of the present application, the first semiconductor layer 101b and the second semiconductor layer 102b, such as a cladding layer or a confinement layer, have different conductivity types, electrical properties, polarities, or doping elements for providing electrons or holes. For example, the first semiconductor layer 101b is an n-type semiconductor and the second semiconductor layer 102b is a p-type semiconductor. The active layer 103b is formed between the first semiconductor layer 101b and the second semiconductor layer 102b. The electrons and holes combine in the active layer 103b under a current driving to convert electric energy into light energy to emit a light. The wavelength of the light emitted from the light-emitting device 3 or the light-emitting device 4 is adjusted by changing the physical and chemical composition of one or more layers in the semiconductor stack 10b. The material of the semiconductor stack 10b comprises a group III-V semiconductor material, such as $Al_xIn_yGa_{(1-x-y)}N$ or $Al_xIn_yGa_{(1-x-y)}P$, wherein $0 \leq x$, $y \leq 1$; $(x+y) \leq 1$. According to the material of the active layer 103b, when the material of the semiconductor stack 10b is AlInGaP series material, red light having a wavelength between 610 nm and 650 nm or yellow light having a wavelength between 550 nm and 570 nm can be emitted. When the material of the semiconductor stack 10b is InGaN series material, blue light having a wavelength between 450 nm and 490 nm or green light having a wavelength between 490 nm and 550 nm can be emitted. When the material of the semiconductor stack 10b is AlGaN series material, UV light having a wavelength between 400 nm and 250 nm can be emitted. The active layer 103a can be a single heterostructure (SH), a double heterostructure (DH), a double-side double heterostructure (DDH), a multi-quantum well structure (MQW). The material of the active layer 103b can be i-type, p-type, or n-type semiconductor.

Figure 13A:
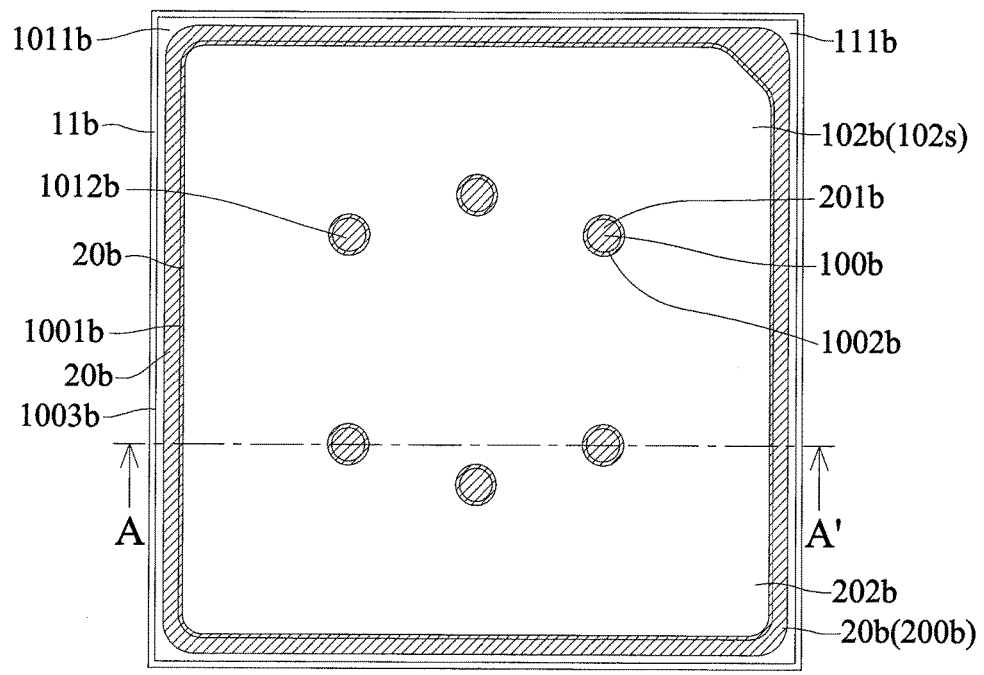
Figure 13B:
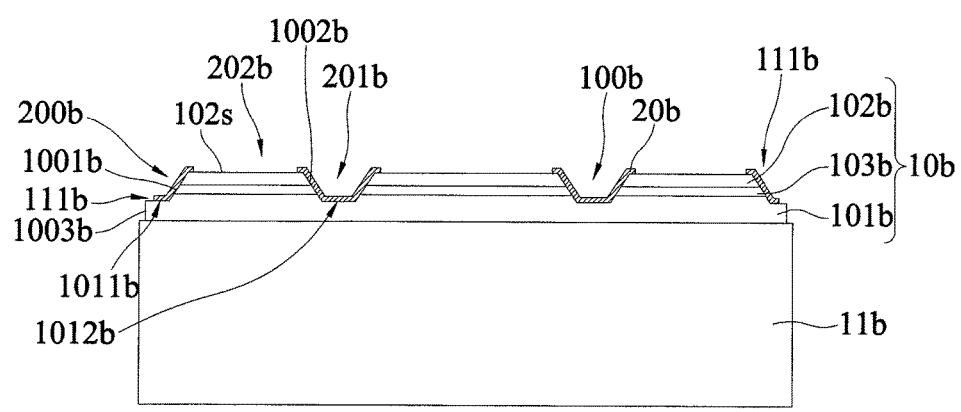

Following the step of forming the mesa, as a top view of FIG. 13A and a cross-sectional view of FIG. 13B which is taken along line A-A' of FIG. 13A show, the manufacturing method of the light-emitting device 3 or the light-emitting device 4 comprises a step of forming a first insulating layer. A first insulating layer 20b can be formed on the semiconductor structure 1000b by sputter or vapor deposition, and patterned by lithography and etching to cover the first surface 1011b of the surrounding part 111b and the second surface 1012b of the via 100b, and cover the second outside wall 1001b of the second semiconductor layer 102b and the active layer 103b of the semiconductor structure 1000b and the inside wall 1002b of the semiconductor structure 1000b. The first insulating layer 20b comprises a first insulating surrounding region 200b covering the surrounding part 111b, thereby the first surface 1011b of the first semiconductor layer 101b on the surrounding part 111b is covered by the first insulating surrounding region 200b; a first group of first insulating covering regions 201b covering the vias 100b, thereby the second surfaces 1012b of the first semiconductor layer 101b on the via 100b are covered by the first group of first insulating covering regions 201b; and a second group of first insulating openings 202b exposing the surface 102s of the second semiconductor layer 102b. The first group of first insulating covering regions 201b is separated from each other and is respectively corresponding to the multiple vias 100b. The first insulating layer 20b includes one layer or multiple layers. When the first insulating layer 20b includes one layer, the first insulating layer 20b protects the sidewall of the semiconductor structure 1000b to prevent the active layer 103b from being destroyed by the following processes. When the first insulating layer 20b includes multiple layers, the first insulating layer 20b comprises two or more layers having different refractive indexes alternately stacked to form a Distributed Bragg reflector (DBR) which can selectively reflect light of a specific wavelength. The first insulating layer 20b is composed of a non-conductive material comprising organic material, such as Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, fluorocarbon polymer, or inorganic material, such as silicone, glass, or dielectric material, such as aluminum oxide ($Al_2O_3$), silicon nitride ($SiN_x$), silicon oxide ($SiO_x$), titanium oxide ($TiO_x$), or magnesium fluoride ($MgF_x$).

Figure 14A:
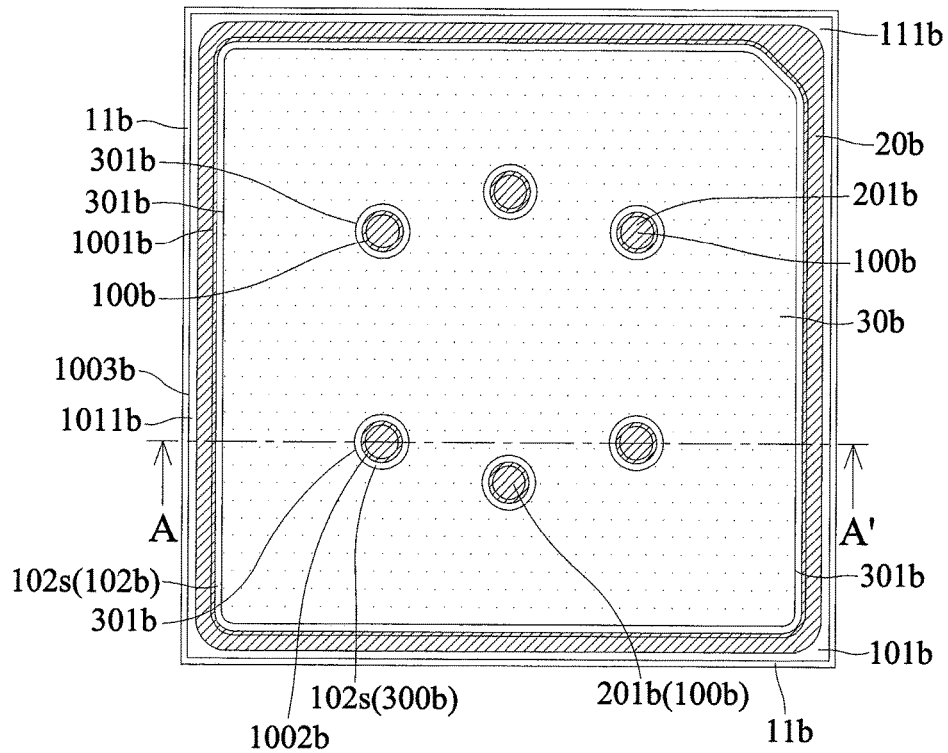
Figure 14B:
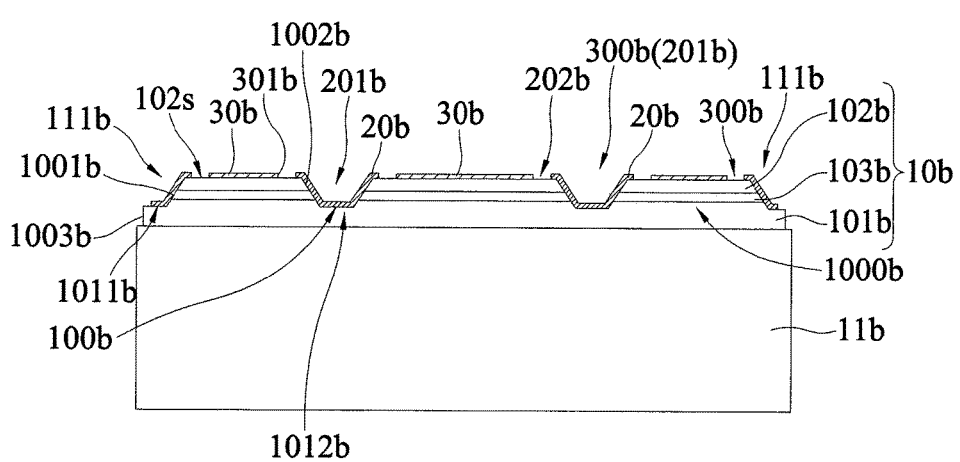

In an embodiment of the present application, following the step of forming the first insulating layer, as a top view in FIG. 14A and a cross-sectional view in FIG. 14B which is taken along line A-A' of FIG. 14A show, the manufacturing method of the light-emitting device 3 or the light-emitting device 4 comprises a step of forming a transparent conductive layer. A transparent conductive layer 30a can be formed on the semiconductor structure 1000b by sputter, vapor deposition or the like, and contacts the second semiconductor layer 102b, wherein the transparent conductive layer 30a does not cover the via 100b. As the top view of the light-emitting device 3 or the light-emitting device 4 shows, the transparent conductive layer 30b is substantially formed on the entire surface of the second semiconductor layer 102b. Specifically, the transparent conductive layer 30b can be formed in the second group of first insulating openings 202b by sputter, vapor deposition or the like, wherein an outer edge 301b of the transparent conductive layer 30b is spaced apart from the first insulating layer 20b with a distance to expose the surface 102s of the second semiconductor layer 102b. The transparent conductive layer 30b comprises one or multiple transparent conductive layer openings 300b respectively corresponding to the one or multiple vias and/or the first group of first insulating covering regions 201b, wherein the outer edge 301b of the transparent conductive layer openings 300b is separated from the inside wall 1002b of the semiconductor structure 1000b and/or an outer edge of the via 100b with a distance and the outer edge of the transparent conductive layer openings 300b surrounds the outer edge of the via 100b or the first group of first insulating covering regions 201b. The material of the transparent conductive layer 30b comprises a material transparent to the light emitted from the active layer 103b, such as indium tin oxide (ITO) or indium zinc oxide (IZO).

In another embodiment of the present application, after the step of forming the mesa, the step of forming the transparent conductive layer can be performed first and is followed by the step of forming the first insulating layer.

In another embodiment of the present application, after the step of forming the mesa, the step of forming the first insulating layer can be omitted so the step of forming the transparent conductive layer can be directly performed.

Figure 15A:
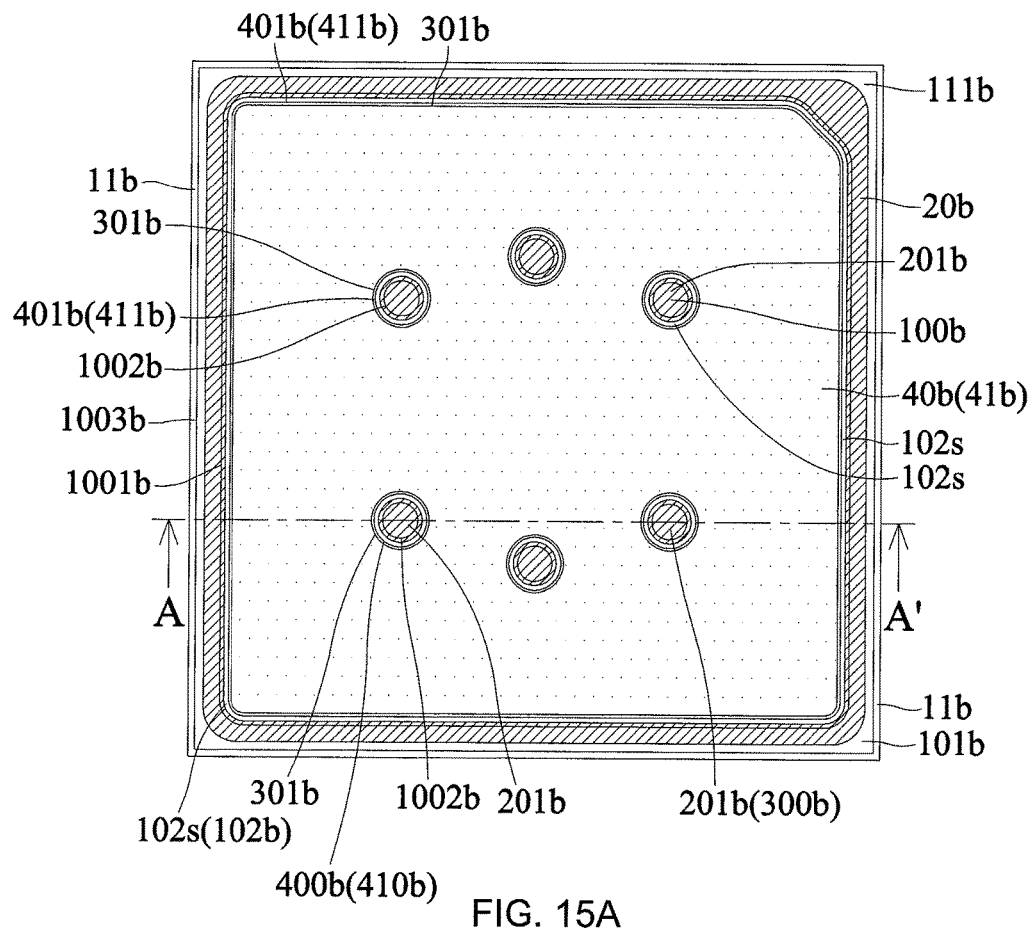
Figure 15B:
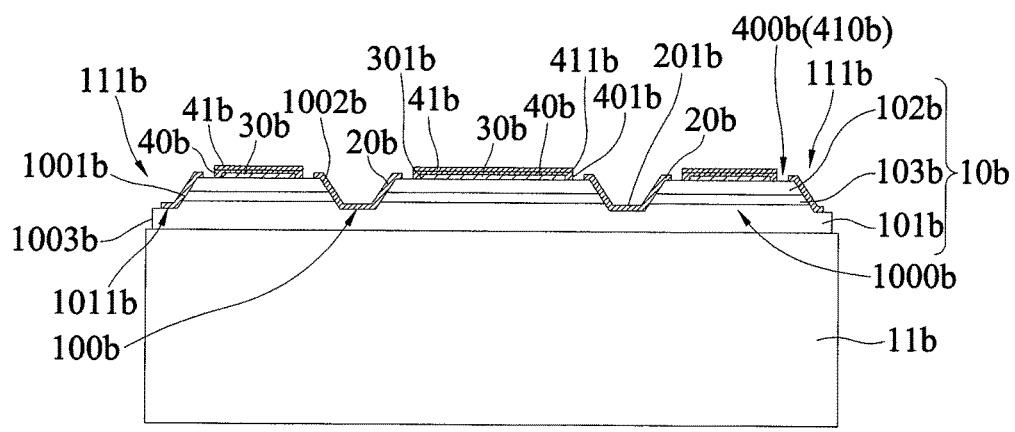

In an embodiment of the present application, following the step of forming the transparent conductive layer, as a top view in FIG. 15A and a cross-sectional view in FIG. 15B which is taken along line A-A' of FIG. 15A show, the manufacturing method of the light-emitting device 3 or the light-emitting device 4 comprises a step of forming a reflective structure. The reflective structure comprises a reflective layer 40b and/or a barrier layer 41b, which can be directly formed on the transparent conductive layer 30b by sputter, vapor deposition, or the like, wherein the reflective layer 40b is formed between the transparent conductive layer 30b and the barrier layer 41b. As the top view of the light-emitting device 3 or the light-emitting device 4 shows, the reflective layer 40b and/or the barrier layer 41b is substantially formed on the entire surface of the second semiconductor layer 102b. An outer edge 401b of the reflective layer 40b may be disposed on the inner side or the outer side of the outer edge 301b of the transparent conductive layer 30b, or may be disposed to overlap with the outer edge 301b of the transparent conductive layer 30b. The outer edge 411b of the barrier layer 41b can be disposed on the inner side or the outer side of the outer edge 401b of the reflective layer 40b or provided to overlap with the outer edge 401b of the reflective layer 40b. The reflective layer 40b comprises one or multiple reflective layer openings 400b respectively corresponding to the one or multiple vias 100b. The barrier layer 41b comprises one or multiple barrier layer openings 410b respectively corresponding to the one or multiple vias 100b. The transparent conductive layer openings 300b, the reflective layer opening 400b, and the barrier layer opening 410b overlap each other. An outer edge of the reflective layer opening 400b and/or an outer edge of the barrier layer opening 410b are separated from an outer edge of the via 100b with a distance, and the outer edge of the reflective layer opening 400b and/or the outer edge of the barrier layer opening 410b surround the outer edge of the via 100b.

In another embodiment of the present application, the step of forming the transparent conductive layer can be omitted, and the step of forming the reflective structure is directly performed after the step of forming the mesa or the step of forming the first insulating layer. For example, the reflective layer 40b and/or the barrier layer 41b is directly formed on the second semiconductor layer 102b and the reflective layer 40b is formed between the second semiconductor layer 102b and the barrier layer 41b. The reflective layer 40b includes one layer or multiple layers, such as a Distributed Bragg reflector (DBR). The material of the reflective layer 40b comprises a metal material having a high reflectance, for example, silver (Ag), aluminum (Al), or rhodium (Rh), or an alloy of the above materials. The high reflectance referred to herein means having 80% or more reflectance for a wavelength of a light emitted from the light-emitting device 3 or the light-emitting device 4. In an embodiment of the present application, the barrier layer 41b covers the reflective layer 40b to prevent the surface of the reflective layer 40b from being oxidized that deteriorates the reflectivity of the reflective layer 40b. The material of the barrier layer 41b comprises metal material, such as titanium (Ti), tungsten (W), aluminum (Al), indium (In), tin (Sn), nickel (Ni), platinum (Pt), or an alloy of the above materials. The barrier layer 41b includes one layer or multiple layers, such as titanium (Ti)/aluminum (Al) and/or titanium (Ti)/tungsten (W). In an embodiment of the present application, the barrier layer 41b comprises titanium (Ti)/aluminum (Al) on one side away from the reflective layer 40b and titanium (Ti)/tungsten (W) on another side adjacent to the reflective layer 40b. In an embodiment of the present application, the material of the reflective layer 40b and the barrier layer 41b comprises a metal material other than gold (Au) or copper (Cu).

Figure 16A:
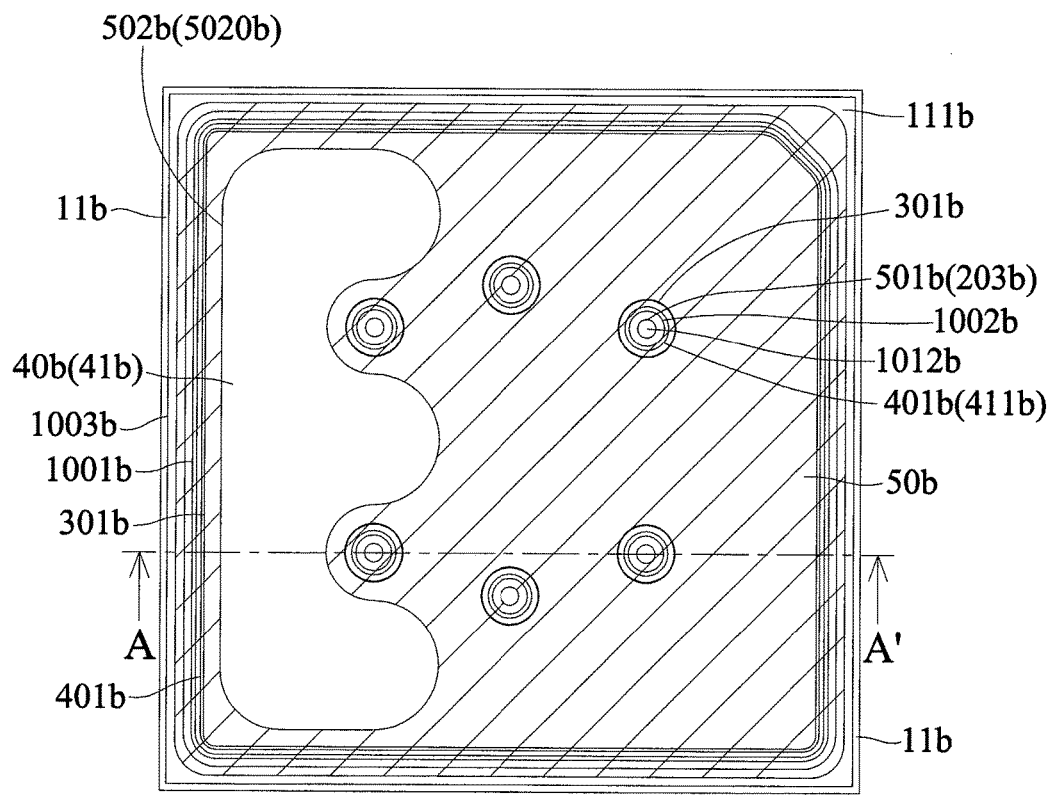
Figure 16B:
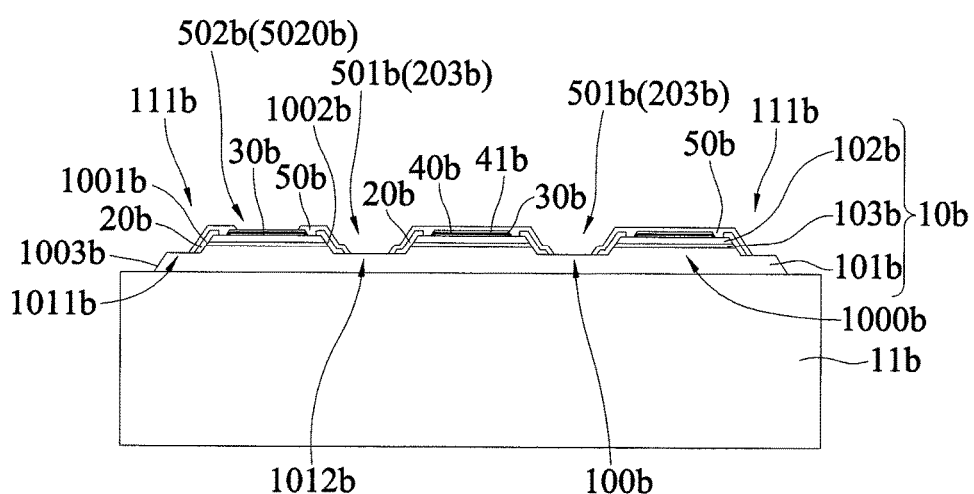

In an embodiment of the present application, following the step of forming the reflective structure, as a top view in FIG. 16A, and a cross-sectional view in FIG. 16B which is taken along line A-A' of FIG. 16A show, the manufacturing method of the light-emitting device 3 or the light-emitting device 4 comprises a step of forming a second insulating layer. A second insulating layer 50b can be formed on the semiconductor stack 10b by sputter or vapor deposition, etc., and then patterned by lithography and etching to form a first group of second insulating openings 501b to expose the first semiconductor layer 101b and a second group of second insulating openings 502b to expose the reflective layer 40b or the barrier layer 41b. During the patterning of the second insulating layer 50b, the first insulating surrounding region 200b which covers the surrounding part 111b and the first group of first insulating covering regions 201b which covers the vias 100b are partially etched and a first group of first insulating openings 203b is formed in the vias 100b to expose the first semiconductor layer 101b. In an embodiment of the present application, as shown in FIG. 16A, the first group of second insulating openings 501b are separated from each other and respectively corresponding to the multiple vias 100b. The second group of second insulating openings 502b is close to one side of the substrate 11b, for example, the left side or the right side of the substrate 11b. In an embodiment, a number of the second group of second insulating openings 502b comprises one or more. In the embodiment, the second group of second insulating openings 502b is connected to each other to form an annular opening 5020b. The shape of the annular opening 5020b comprises comb, rectangle, ellipse, circle, or polygon viewing from the top of the light-emitting device 3. In an embodiment of the present application, the second insulating layer 50b includes one layer or multiple layers. When the second insulating layer 50b includes multiple layers, the second insulating layer 50b comprises two or more layers having different refractive index alternately stacked to form a Distributed Bragg reflector (DBR) which can selectively reflect light of a specific wavelength. The second insulating layer 50b is composed of a non-conductive material comprising organic material, such as Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, fluorocarbon polymer, or inorganic material, such as silicone, glass, or dielectric material, such as aluminum oxide ($Al_2O_3$), silicon nitride ($SiN_x$), silicon oxide ($SiO_x$), titanium oxide ($TiO_x$), or magnesium fluoride ($MgF_x$).

Figure 17A:
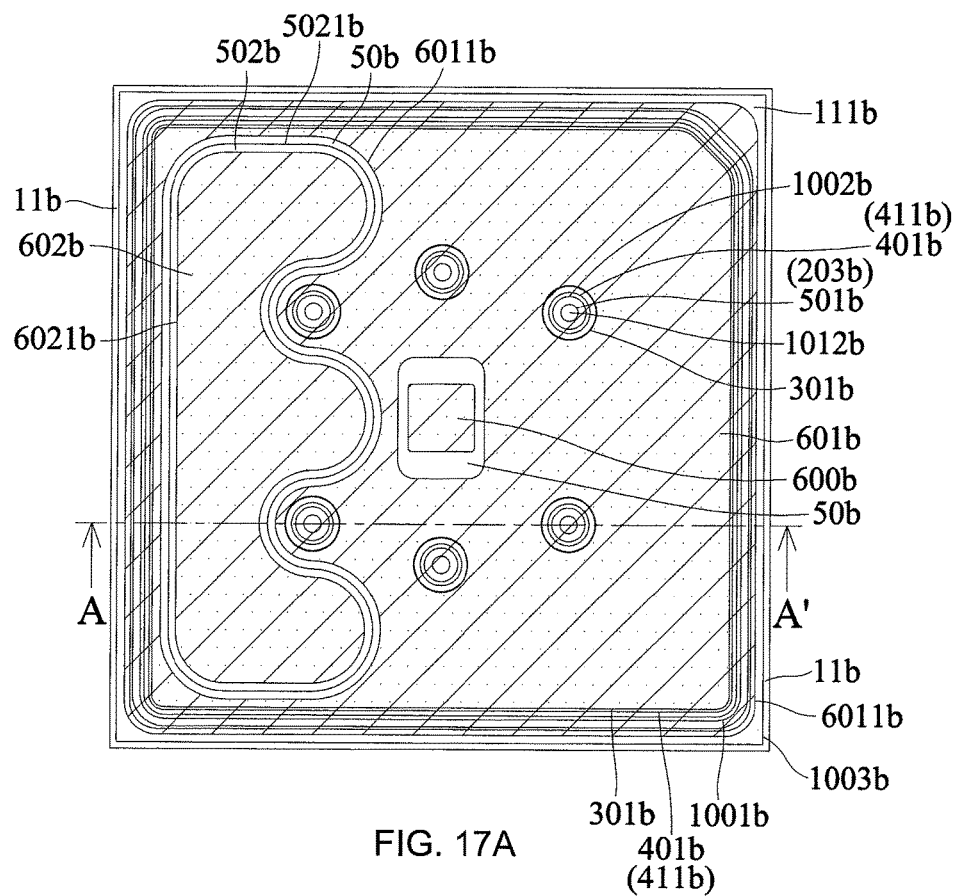
Figure 17B:
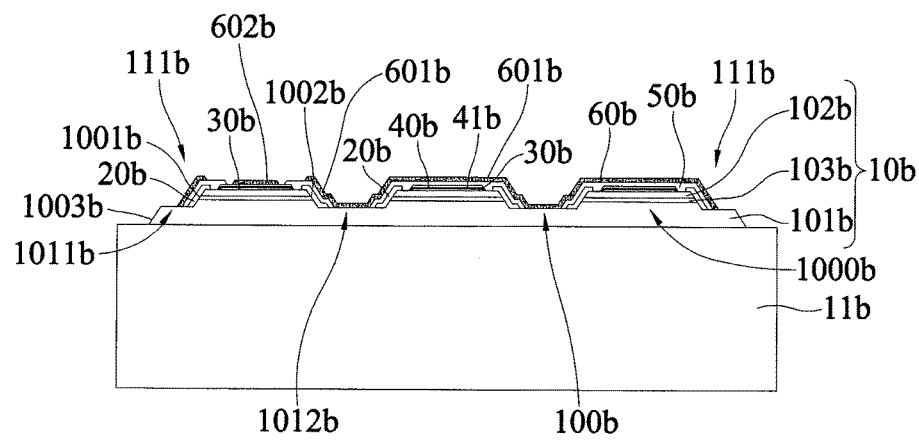

Following the step of forming the second insulating layer, in an embodiment of the present application, as a top view of FIG. 17A and a cross-sectional view in FIG. 17B show, the manufacturing method of the light-emitting device 3 or the light-emitting device 4 comprises a step of forming a contact layer. A contact layer 60b can be formed on the semiconductor stack 10b by sputter or vapor deposition, etc., and then patterned by photolithography and etching to form a first contact layer 601b and a second contact layer 602b. The first contact layer 601b covers all the first group of second insulating openings 501b, fills into the one or multiple vias 100b to contact with the first semiconductor layer 101b, and extends over the second insulating layer 50b and the second semiconductor layer 102b, wherein the first contact layer 601b is insulated from the second semiconductor layer 102b by the second insulating layer 50b. The second contact layer 602b is formed in the annular opening 5020b of the second insulating layer 50b to contact the reflective layer 40b and/or the barrier layer 41b, wherein the sidewall 6021b of the second contact layer 602b and the sidewall 5021b of the annular opening 5020b are separated with a distance. The sidewall 6011b of the first contact layer 601b is separated from the sidewall 6021b of the second contact layer 602b with a distance. The first contact layer 601b does not contact the second contact layer 602b and the first contact layer 601b and the second contact layer 602b are electrically isolated by part of the second insulating layer 50b. In the top view, the first contact layer 601b covers the surrounding part 111b of the semiconductor stack 10b such that the first contact layer 601b surrounds the second contact layer 602b. In the top view of FIG. 17A, the second contact layer 602b is close to one side of the substrate 11b, for example, the left or right side of the substrate 11b. The contact layer 60b defines a pin region 600b at the geometric center in the top view of the semiconductor stack 10b. The pin region 600b does not contact the first contact layer 601b and the second contact layer 602b and is electrically isolated from the first contact layer 601b and the second contact layer 602b. The pin region 600b comprises the same material as that of the first contact layer 601b and/or the second contact layer 602b. The pin region 600b serves as a structure for protecting the epitaxial stack to prevent the epitaxial stack from being damaged in the post process, such as die separation, die testing, or encapsulation. The contact layer 60b includes one layer or multiple layers. In order to reduce the resistance contacting the first semiconductor layer 101b, the material of the contact layer 60b comprises a metal material, such as chromium (Cr), titanium (Ti), tungsten (W), gold (Au), aluminum (Al), indium (In), tin (Sn), nickle (Ni), platinum (Pt), or an alloy of the above materials. In one embodiment of the application, the material of the contact layer 60b comprises a metal material other than gold (Au), copper (Cu). In an embodiment of the present application, the material of the contact layer 60b comprises a metal having high reflectivity, such as aluminum (Al) or platinum (Pt). In an embodiment of the present application, one side of the contact layer 60b contacting with the first semiconductor layer 101b comprises chromium (Cr) or titanium (Ti) to increase the bonding strength joining the first semiconductor layer 101b.

Figure 18A:
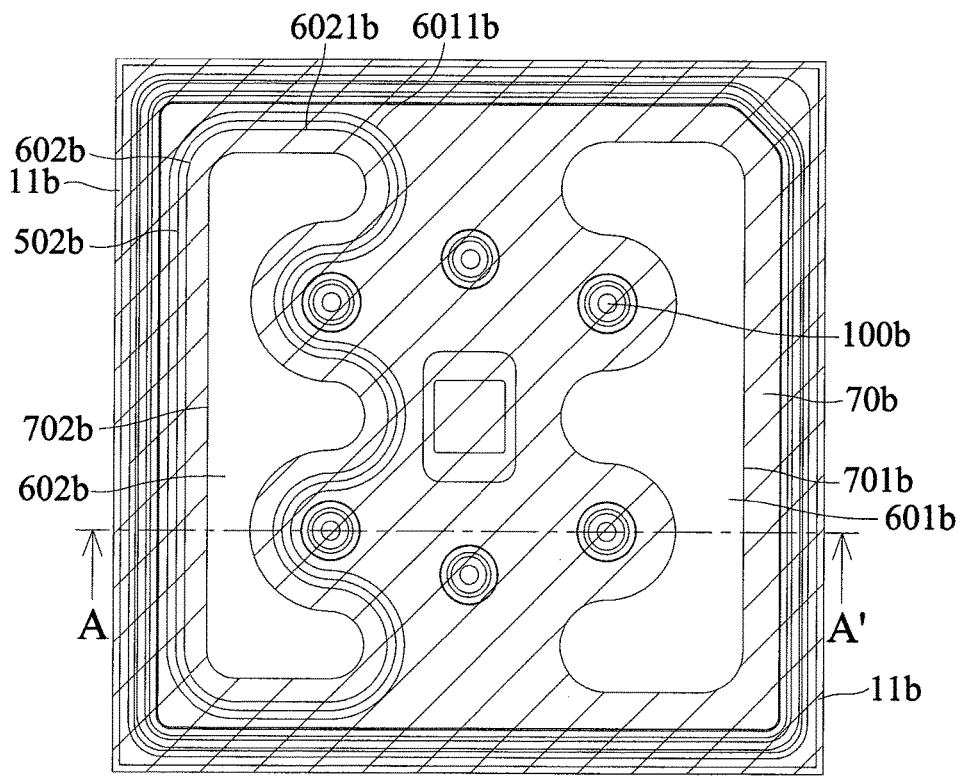
Figure 18B:
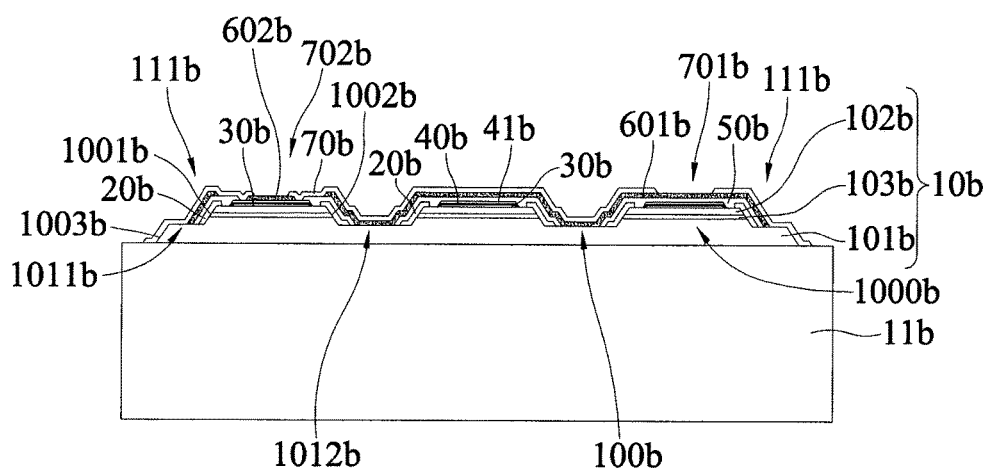

In an embodiment of the present application, follow the contact layer forming step of FIG. 17A and FIG. 17B, the manufacturing method of the light-emitting device 3 or the light-emitting device 4 comprises a step of forming a third insulating layer. As a top view in FIG. 18A and a cross-sectional view in FIG. 18B which is taken along line A-A' of FIG. 18A show, a third insulating layer 70b can be formed on the semiconductor stack 10b by sputter or vapor deposition, etc., and then patterned by lithography and etching to form a first third insulating opening 701b on the first contact layer 601b to expose the first contact layer 601b shown in FIG. 17A and form a second third insulating opening 702b to expose the second contact layer 602b shown in FIG. 17A, wherein part of the first contact layer 601b formed on the second semiconductor layer 102b is interposed between the second insulating layer 50b and the third insulating layer 70b. In the present embodiment, as shown in FIG. 18A, the first third insulating opening 701b and the second third insulating opening 702b are around the one or multiple vias 100b. In the present embodiment, the first third insulating opening 701b and/or the second third insulating opening 702b is an annular opening and the shape of the annular opening comprises comb, rectangular, oval, circular, or polygon viewing from the top. In the top view of FIG. 18A, the first third insulating opening 701b is close to one side of the substrate 11b, for example, the right side of the substrate 11b. The second third insulating opening 702b is close to another side of the substrate 11b, for example, the left side of the substrate 11b. In the cross-sectional view, the first third insulating opening 701b comprises a width larger than a width of the second third insulating opening 702b. The first third insulating layer 70b includes one layer or multiple layers. When the third insulating layer 70b includes multiple layers, the third insulating layer 70b comprises two or more layers having different refractive index alternately stacked to form a Distributed Bragg reflector (DBR) which can selectively reflect light of a specific wavelength. The third insulating layer 70b is composed of a non-conductive material comprising organic material, such as Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, fluorocarbon polymer, or inorganic material, such as silicone, glass, or dielectric material, such as aluminum oxide ($Al_2O_3$), silicon nitride ($SiN_x$), silicon oxide ($SiO_x$), titanium oxide ($TiO_x$), or magnesium fluoride ($MgF_x$).

Figure 19:
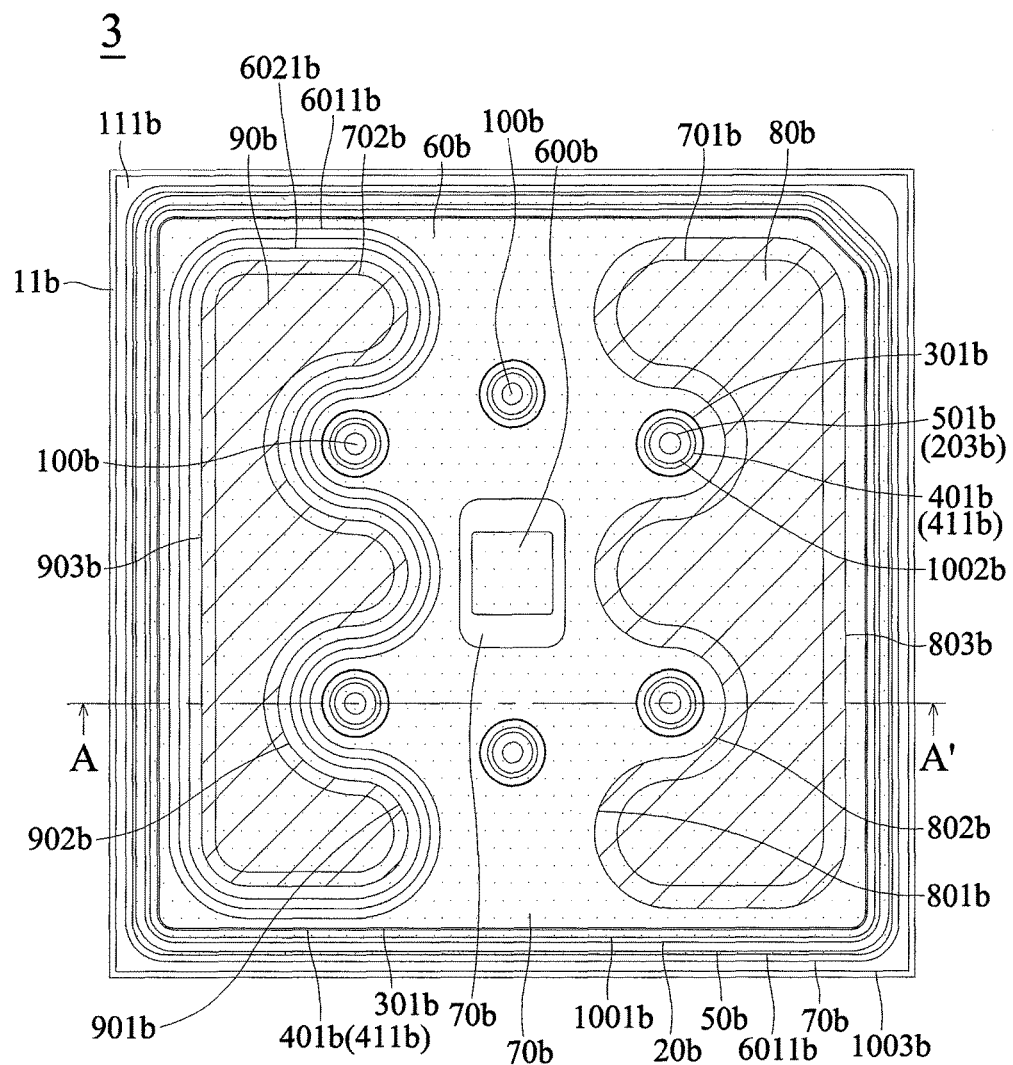
FIG. 19 illustrates a top view of the light-emitting device 3 in accordance with an embodiment of the present application.

Following the step of forming the third insulating layer, the manufacturing method of the light-emitting device 3 or the light-emitting device 4 comprises a step of forming a pad. As shown in the top view of FIG. 19, a first pad 80a and a second pad 90a can be formed on the semiconductor stack 10b by plating, sputter or vapor deposition and then patterned by lithography and etching. As the top view in FIG. 19 shows, the first pad 80b is adjacent to one side of the substrate 11a, for example, the right side, and the second pad 90b is adjacent to another side of the substrate 11b, for example, the left side. The first pad 80b contacts the first contact layer 601b through the first third insulating opening 701b and is electrically connected to the first semiconductor layer 101b through the first contact layer 601b. The second pad 90b contacts the reflective layer 40b and/or the barrier layer 41b and is electrically connected to the second semiconductor layer 102b through the reflective layer 40b and/or the barrier layer 41b. The first pad 80b comprises a plurality of first protrusions 801b and a plurality of first recesses 802b alternately connected to each other. The second pad 90b comprises a plurality of second protrusions 901b and a plurality of second recesses 902b alternately connected to each other. The position of the first recess 802b of the first pad 80b and the position of the second recess 902b of the second pad 90b substantially correspond to the positions of the vias 100b. In other words, the first pad 801b and the second pad 802b do not cover any of the vias 100b, the first recess 802b of the first pad 80b, and the second recess 902b of the second pad 90b surround the via 100b, and are formed around the via 100b such that the width of the first recess 802b of the first pad 80b or the width of the second recess 902b of the second pad 90b is larger than the diameter of any via 100b. In an embodiment of the present application, the plurality of first recesses 802b is substantially aligned with the plurality of second recesses 902b in the top view. In another embodiment of the present application, the plurality of first recesses 802b is offset from the plurality of second recesses 902b in the top view.

In an embodiment of the present application, as shown in FIG. 19, the first pad 80b covers the first third insulating opening 701b and the second pad 90b covers the second third insulating opening 702b. Since the first third insulating layer opening 701b comprises a maximum width greater than a maximum width of the second third insulating opening 702b, the first pad 80b comprises a maximum width greater than a maximum width of the second pad 90b. The first pad 80b and the second pad 90b comprise different sizes for the identification of the electrical connection of the pad and the solder pad during soldering to avoid the occurrence of bonding to the wrong electrical pad.

In an embodiment of the present application, the first third insulating opening 701b comprises an area larger or smaller than an area of the first pad 80b in the top view of the light-emitting device.

In another embodiment of the present application, a shortest distance between the first protrusion 801b and the second protrusion 901b is smaller than a maximum distance between the first recess 802b and the second recess 902b.

In a another embodiment of the present application, the first pad 80b comprises a first flat edge 803b opposite to the first protrusion 801b and the first recess 802b, and the second pad 90b comprises a second flat edge 903b opposite to the second protrusion 901b and the second recess 902b. A maximum distance between the first flat edge 803b of the first pad 80b and the first protrusion 801b is larger than a shortest distance between the first protrusion 801b and the second protrusion 901b. A maximum distance between the second flat edge 903b of the second pad 90b and the second protrusion 901b is larger than a shortest distance between the first protrusion 801b and the second protrusion 901b.

In another embodiment of the present application, the curvature radius of the first plurality of first recesses 802b of the first pad 80b is different from the curvature radius of the plurality of first protrusions 801b of the first pad 80b. For example, the curvature radius of the plurality of first recesses 802b of the first pad 80b is larger or smaller than the curvature radius of the plurality of first protrusions 801b of the first pad 80b. In another embodiment of the application, the curvature radius of the plurality of second recesses 902b of the second pad 90b is larger or less than the curvature radius of the plurality of second protrusions 901b of the second pad 90b.

In another embodiment of the present application, the curvature radius of the first protrusions 801b of the first pad 80b is larger or less than the curvature radius of the second protrusions 901b of the second pad 90b.

In another embodiment of the present application, the plurality of first recesses 802b of the first pad 80b faces the plurality of second recesses 902b of the second pad 90b and the curvature radius of the plurality of first recesses 802b is larger or less than the curvature radius of the plurality of second recesses 902b.

In another embodiment of the present application, the first pad 80b comprises a shape different from a shape of the second pad 90b, for example, the first pad 80b comprises a rectangular shape, and the second pad 90b comprises a comb shape.

In another embodiment of the present application, the first pad 80b comprises a size different from a size of the second pad 90b, for example, the first pad 80b comprises an area larger than an area of the second pad 90b.

Figure 20:
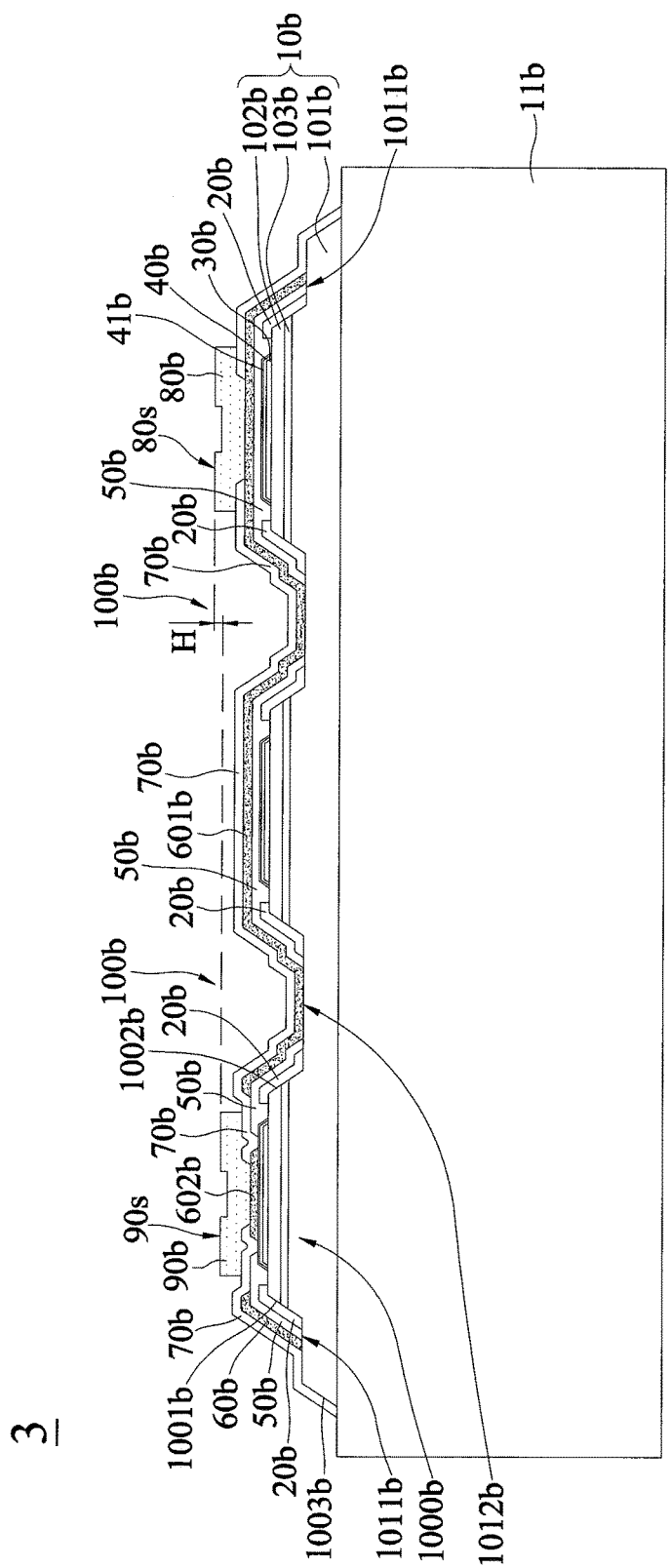
FIG. 20 illustrates a cross-sectional view of the light-emitting device 3 in accordance with an embodiment of the present application.

FIG. 20 is a cross-sectional view taken along line A-A' of FIG. 19. In accordance with the embodiment, the light-emitting device 3 is a flip-chip type of light-emitting diode. The light-emitting device 3 comprises a substrate 11b and one or multiple semiconductor structures 1000b on the substrate 11b, wherein the semiconductor structure 1000b comprises a semiconductor stack 10b having a first semiconductor layer 101b, a second semiconductor layer 102b, and an active layer 103b between the first semiconductor layer 101b and the second semiconductor layer 102b. The multiple semiconductor structures 1000b are connected to each other through the first semiconductor layer 101b. The light-emitting device 3 also comprises a surrounding part 111b surrounding the one or multiple semiconductor structures 1000b and a first pad 80b and a second pad 90b formed on the one or multiple semiconductor structures 1000b, wherein the surrounding part 111b exposes a first surface 1011b of the first semiconductor layer 101b. As shown in FIG. 19 and FIG. 20, the one or multiple semiconductor structures 1000b respectively comprises a plurality of outside walls 1001b and a plurality of inside walls 1002b. One end of the outside wall 1001b is connected to a surface 102s of the second semiconductor layer 102b and another end of the outside wall 1001b is connected to the first surface 1011b of the first semiconductor layer 101b. One end of the inside wall 1002b is connected to the surface 102s of the second semiconductor layer 102b and another end of the inside wall 1002b is connected to a second surface 1012b of the first semiconductor layer 101b.

In an embodiment of the present application, the light-emitting device 3 comprises a side larger than 30 mil and further comprises one or multiple vias penetrating through second semiconductor layer 102b and the active layer 103b to expose one or more second surfaces 1012b. The light-emitting device 3 also comprises a contact layer 60b formed on the first surface 1011b of the first semiconductor layer 101b to surround the one or multiple semiconductor structures 1000b and contact the first semiconductor layer 101b for forming electrical connection, and the contact layer 60b is formed on the one or more second surfaces 1012b of the first semiconductor layer 101b to cover the one or multiple vias 100b and contact the first semiconductor layer 101b for forming electrical connection. The contact layer 60b comprises a first contact layer 601b and a second contact layer 602b. The first contact layer 601b is formed on the second semiconductor layer, surrounds a sidewall of the second semiconductor layer, and is connected to the first semiconductor layer. The second contact layer 602b is formed on the second semiconductor layer and connected to the second semiconductor layer. The second contact layer 602b is surrounded by the first contact layer 601b while the first contact layer 601b and the second contact layer 602b do not overlap each other.

In an embodiment of the present application, the light-emitting device 3 does not comprise any via 100b in order to increase the light-emitting area.

In an embodiment of the present application, the contact layer 60b comprises a total surface area larger than a total surface area of the active layer 103b in the top view of the light-emitting device 3.

In an embodiment of the present application, a total length of a periphery of the contact layer 60b is larger than a total length of a periphery of the active layer 103b in the top view of the light-emitting device 3.

In an embodiment of the present application, the first contact layer 601b comprises an area larger than an area of the second contact layer 602b in the top view of the light-emitting device 3.

In an embodiment of the present application, the first pad 80b and the second pad 90b are formed in positions outside the via 100b. In other words, the via 100b is not covered by the first pad 80b or the second pad 90b.

In an embodiment of the present application, the first contact layer 601b connected to the first semiconductor layer 101b is not disposed under the second pad 90b viewing from the cross-section of the light-emitting device 3.

In an embodiment of the present application, a shortest distance between the first pad 80b and the second pad 90b is larger than 50 μm.

In an embodiment of the present application, a distance between the first pad 80b and the second pad 90b is smaller than 300 μm.

In an embodiment of the present application, the first pad 80b and the second pad 90b comprise a structure having one or more layers comprising a metal material. The materials of the first pad 80b and the second pad 90b comprise metal materials, such as chromium (Cr), titanium (Ti), tungsten (W), aluminum (Al), indium (In), tin (Sn), nickle (Ni), platinum (Pt), or an alloy of the above materials. When the first pad 80b and the second pad 90b include multiple layers, the first pad 80b comprises a first lower pad (not shown) and a first upper pad (not shown), and the second pad 90b comprises a second lower pad (not shown) and a second upper pad (not shown). The upper pad and the lower pad have different functions. The function of the upper pad is used for soldering and wiring. The light-emitting device 3 is flipped and mounted onto the package substrate by using solder bonding or AuSn eutectic bonding through the upper pad. The metal material of the upper pad comprises highly ductile materials such as nickel (Ni), cobalt (Co), iron (Fe), titanium (Ti), copper (Cu), gold (Au), tungsten (W), zirconium (Zr), molybdenum (Mo), tantalum (Ta), aluminum (Al), silver (Ag), platinum (Pt), palladium (Pd), rhodium (Rh), iridium (Ir), ruthenium (Ru), osmium (Os), or an alloy of the above materials. The upper pad includes one layer or multiple layers. In an embodiment of the present application, the material of the upper pad comprises nickel (Ni) and/or gold (Au) and the upper pad includes one layer or multiple layers. The function of the lower pad is for forming a stable interface with the contact layer 60b, the reflective layer 40b, or the barrier layer 41b, for example, to improve the interface bonding strength between the first lower pad and the contact layer 60b, to enhance the interface bonding strength of the second lower pad and the reflective layer 40b, or to enhance the interface bonding strength of the second lower pad and the barrier layer 41b. Another function of the lower pad is to prevent tin (Sn) in the solder or AuSn from diffusing into the reflective structure and damaging the reflectivity of the reflective structure. Therefore, the lower pad comprises a metal material other than gold (Au) and copper (Cu), such as nickel (Ni), cobalt (Co), iron (Fe), titanium (Ti), tungsten (W), zirconium (Zr), molybdenum (Mo), tantalum (Ta), aluminum (Al), silver (Ag), platinum (Pt), palladium (Pd), rhodium (Rh), iridium (Ir), ruthenium (Ru), or osmium (Os), and the lower pad includes one layer or multiple layers. In an embodiment of the present application, the lower pad comprises multiple layers comprising titanium (Ti) and aluminum (Al), or chromium (Cr) and aluminum (Al).

In an embodiment of the present application, when the light-emitting device 3 is mounted on the package substrate in the form of flip-chip by means of a solder, a height difference H is between the first pad 80b and the second pad 90b. As shown in FIG. 20, the second insulating layer 50b under the first pad 80b covers the reflective layer 40b and the second insulating layer 50b under the second pad 90b comprises the second insulating opening 502b to expose the reflective layer 40b or the barrier layer 41b. When the first pad 80b and the second pad 90b are respectively formed in the first third insulating opening 701b and the second third insulating opening 702b, the most top surface 80s of the first pad 80b is higher than the most top surface 90s of the second pad 90b. In other words, the height difference H is between the most top surface 80s of the first pad 80b and the most top surface 90s of the second pad 90b, and the height difference H between the first pad 80b and the second pad 90b is substantially the same as the thickness of the second insulating layer 50b. In an embodiment, the height difference between the first pad 80b and the second pad 90b is between 0.5 μm and 2.5 μm. For example, the height difference between the first pad 80b and the second pad 90b is 1.5 μm. When the first pad 80b and the second pad 90b are respectively formed in the first third insulating layer opening 701b and the second third insulating layer opening 702b, the first pad 80b contacts the first contact layer 601b through the first third insulating pad opening 701b and extends over partial surface of the second insulating layer 70b from the first third insulating pad opening 701b. The second pad 90b contacts the second contact layer 601b through the second third insulating opening 702b and extends over partial surface of the third insulating layer 70b from the second third insulating opening 702b.

Figure 21:
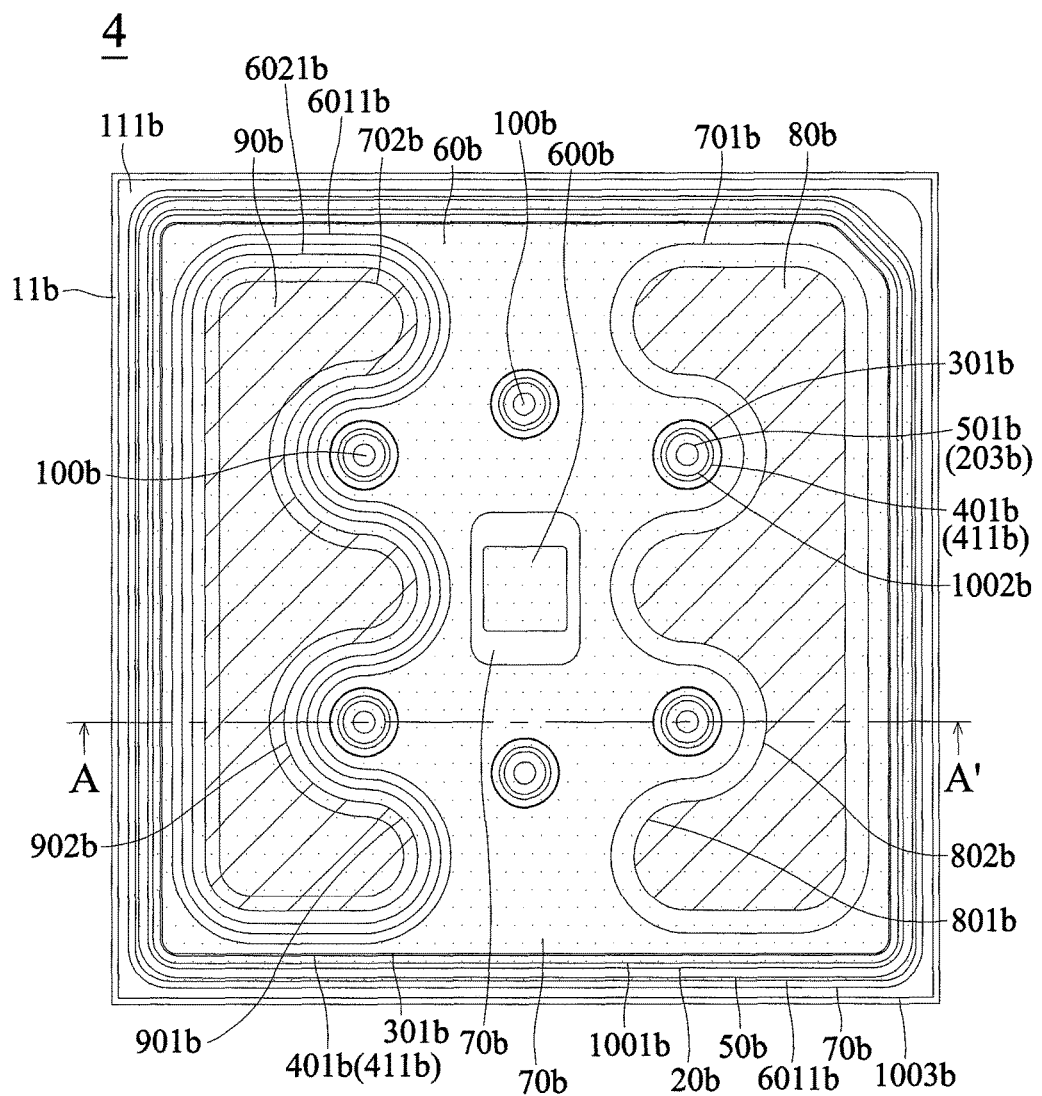
FIG. 21 illustrates a top view of the light-emitting device 4 in accordance with an embodiment of the present application.
Figure 22:
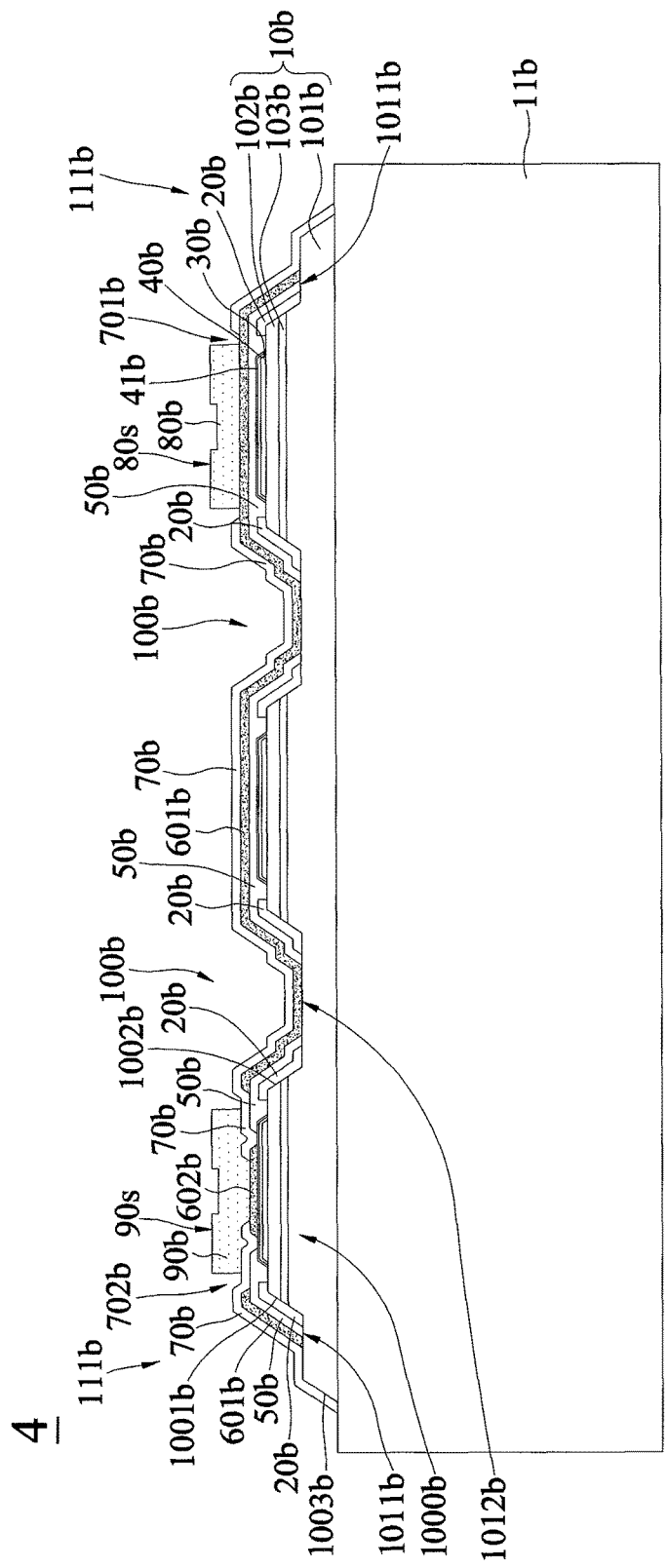
FIG. 22 illustrates a cross-sectional view of the light-emitting device 4 in accordance with an embodiment of the present application.

FIG. 21 illustrates a top view of the light-emitting device 4 in accordance with an embodiment of the present application. FIG. 22 illustrates a cross-sectional view of the light-emitting device 4 in accordance with an embodiment of the present application. As compared with the light-emitting device 3 in the above-described embodiment, in addition to the difference in the structure of the first pad and the second pad, the light-emitting device 4 comprises the same structure as that of the light-emitting device 3, and therefore the structure named by same terms or labelled by same numbers of the light-emitting devices 3 and 4 will be omitted in this embodiment or not repeat them in the following description. When the light-emitting device 4 is mounted onto the package substrate in the form of flip chip by AuSn eutectic bonding, the height difference between the first pad 80b and the second pad 90b is preferably as small as possible to enhance the bonding stability between the pad and the package substrate. As shown in FIG. 22, the second insulating layer 50b under the first pad 80b covers the reflective layer 40b and the second insulating layer 50b under the second pad 90b comprises the second insulating opening 502b to expose the reflective layer 40b or the barrier layer 41b. In the present embodiment, in order to reduce the height difference between the most top surface 80s of the first pad 80b and the most top surface 90s of the second pad 90b, the first third insulating opening 701b comprises a width larger than that of the second third insulating opening 702b. When the first pad 80b and the second pad 90b are respectively formed in the first third insulating layer opening 701b and the second third insulating layer opening 702b, the whole first pad 80b is formed in the first third insulating layer opening 701b to contact the first contact layer 601b. The second pad 90b is formed in the second third insulating opening 702b to contact the reflective layer 40b and/or the barrier layer 41b. The second pad 90b extends from the second third insulating opening 702b to cover a partial surface of the third insulating layer 70b. In other words, the third insulating layer is not formed under the first pad 80b, but is partially formed under the second pad 90b. In this embodiment, the height difference between the first pad 80b and the second pad 90b is smaller than 0.5 μm, preferably less than 0.1 μm, more preferably less than 0.05 μm.

Figure 23:
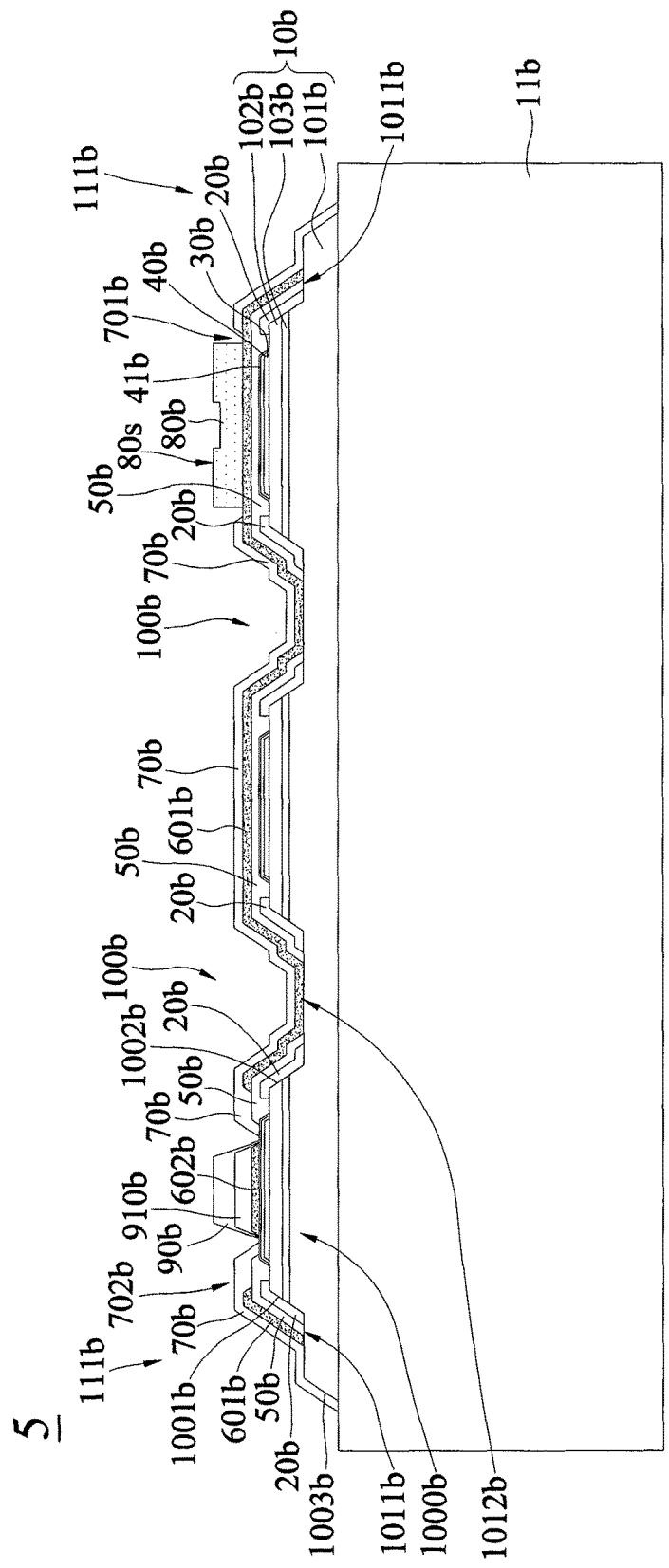
FIG. 23 illustrates a cross-sectional view of a light-emitting device 5 in accordance with an embodiment of the present application.

FIG. 23 illustrates a cross-sectional view of the light-emitting device 5 in accordance with an embodiment of the present application. As compared with the light-emitting devices 3, 4 in the above-described embodiment, in addition to the difference in the structure of the second pad, the light-emitting device 5 comprises the same structure as those of the light-emitting devices 3, 4 and therefore, the structure named by same terms or labelled by same numbers of the light-emitting devices 3, 4 and 5 will be omitted in this embodiment or not repeat them in the following description. When the light-emitting device 5 is mounted onto the package substrate in the form of flip chip by AuSn eutectic bonding, the height difference between the first pad 80b and the second pad 90b is preferably as small as possible to enhance the bonding stability between the pad and the package substrate. As described above, in addition to forming a portion of the third insulating layer under the second pad 90b, a second buffer pad 910b is formed under the second pad 90b to reduce the height difference between the top surface of the first pad 80b and the top surface of the second pad 90b. As shown in FIG. 23, the second insulating layer 50b under the first pad 80b covers the reflective layer 40b, and the second insulating layer 50b under the second pad 90b comprises the second insulating opening 502b to expose the reflective layer 40b or barrier layer 41b. In the embodiment, the whole first pad 80b is formed in the first third insulating opening 701b to contact the first contact layer 601b, and the whole second pad 90b is formed in the second third insulating opening 702b to contact the second contact layer 602b. In other words, the third insulating layer does not formed under the first pad 80b and the second pad 90b. In the embodiment, the second buffer pad 910b is formed between the second pad 90b and the second contact layer 602b to reduce the height difference between the top surface of the first pad 80b and the top surface of the second pad 90b, wherein the second buffer pad 910b comprises a metal material other than gold (Au) and copper (Cu), such as chromium (Cr), nickel (Ni), cobalt (Co), iron (Fe), titanium (Ti), platinum (Pt), palladium (Pd), rhodium (Rh), iridium (Ir), ruthenium (Ru), zirconium (Zr), molybdenum (Mo), tantalum (Ta), aluminum (Al), or osmium (Os) to prevent tin (Sn) of the AuSn eutectic from diffusing into the light-emitting device 5. In the embodiment, the height difference between the top surface of the first pad 80b and the top surface of the second pad 90b is less than 0.5 μm, preferably less than 0.1 μm, more preferably less than 0.05 μm. In the present embodiment, the second buffer pad 910b comprises a thickness substantially same as the thickness of the second insulating layer 50b.

Figure 24:
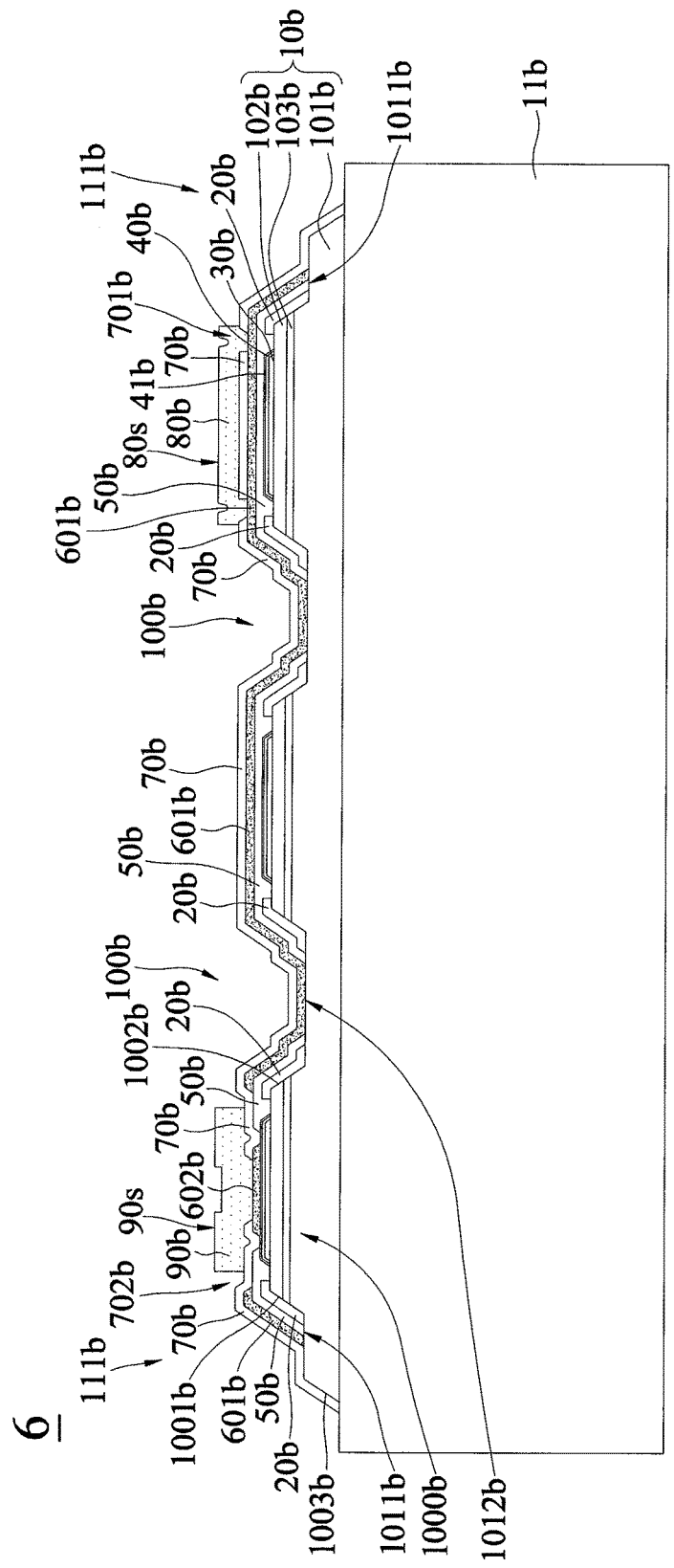
FIG. 24 illustrates a cross-sectional view of a light-emitting device 6 in accordance with an embodiment of the present application.

FIG. 24 illustrates a cross-sectional view of the light-emitting device 6 in accordance with an embodiment of the present application. As compared with the light-emitting devices 3, 4 in the above-described embodiment, in addition to the difference in the structure of the third insulating layer 70b under the first pad 80b, the light-emitting device 6 comprises the same structure as that of the light-emitting devices 3, 4 and therefore, the structure named by same terms or labelled by same numbers of the light-emitting devices 3, 4 and 6 will be omitted in this embodiment or not repeat them in the following description. As shown in FIG. 24, the third insulating layer 70b can be formed on the semiconductor stack 10b by sputter or vapor deposition, etc., and then patterned by lithography and etching to form the first third insulating openings 701b on the first contact layer 601b to expose the first contact layer 601b and the second third insulating opening 702b on the second contact layer 602b to expose the second contact layer 602b. The first pad 80b and the second pad 90b can be formed on the semiconductor stack 10b by plating, sputter or vapor deposition, and then patterned by lithography and etching. The first pad 80b contacts the first contact layer 601b through the first third insulating openings 701b and is electrically connected to the first semiconductor layer 101b through the first contact layer 601b. In the etching process for forming the first third insulating opening 701b, the first contact layer 601b and the second insulation layer 50b under the first pad 80b may be over etched that exposes the reflective layer 40b and/or the barrier layer 41b. In the embodiment, an area of the first third insulating opening 701b is reduced, and a first portion of the third insulating layer 70b is formed between the first pad 80b and the first contact layer 601b and the first portion of the third insulating layer 70b is entirely covered by the first pad 80b. A second portion of the third insulating layer 70b is formed around the first pad 80b. The first third insulating opening 701b is formed between the first portion and the second portion of the third insulating layer 70b. Specifically, the first portion of the third insulating layer 70b completely covered by the first pad 80b comprises a width wider than that of the first third insulating opening 701b under the pad 80b. In the present embodiment, the first third insulating opening 701b is an annular opening in the top view of the light-emitting device.

Figure 25:
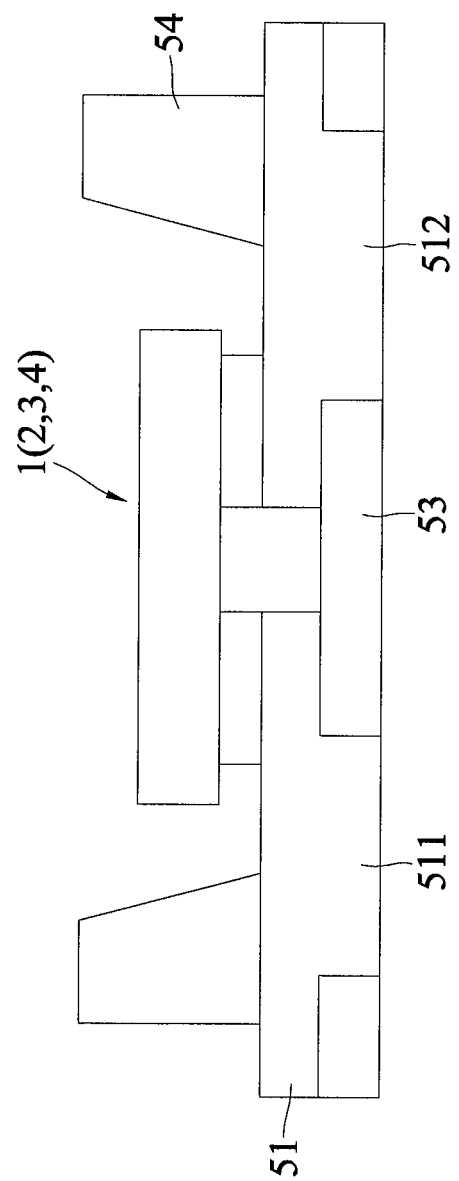
FIG. 25 illustrates a structure diagram of a light-emitting apparatus in accordance with an embodiment of the present application.

FIG. 25 is a schematic view of a light-emitting apparatus according to an embodiment of the present application. The light-emitting device 1, 2, 3, 4, 5, or 6 in the foregoing embodiment is mounted on the first spacer 511 and the second spacer 512 of the package substrate 51 in the form of flip chip. The first spacer 511 and the second spacer 512 are electrically insulated from each other by an insulating portion 53 comprising an insulating material. The main light-extraction surface of the flip-chip type of light-emitting diode is one side of the growth substrates 11a and 11b opposite to the electrode-forming surface. A reflective structure 54 can be provided around the light-emitting devices 1, 2, 3, 4, 5, or 6 to increase the light extraction efficiency of the light-emitting apparatus.

Figure 26:
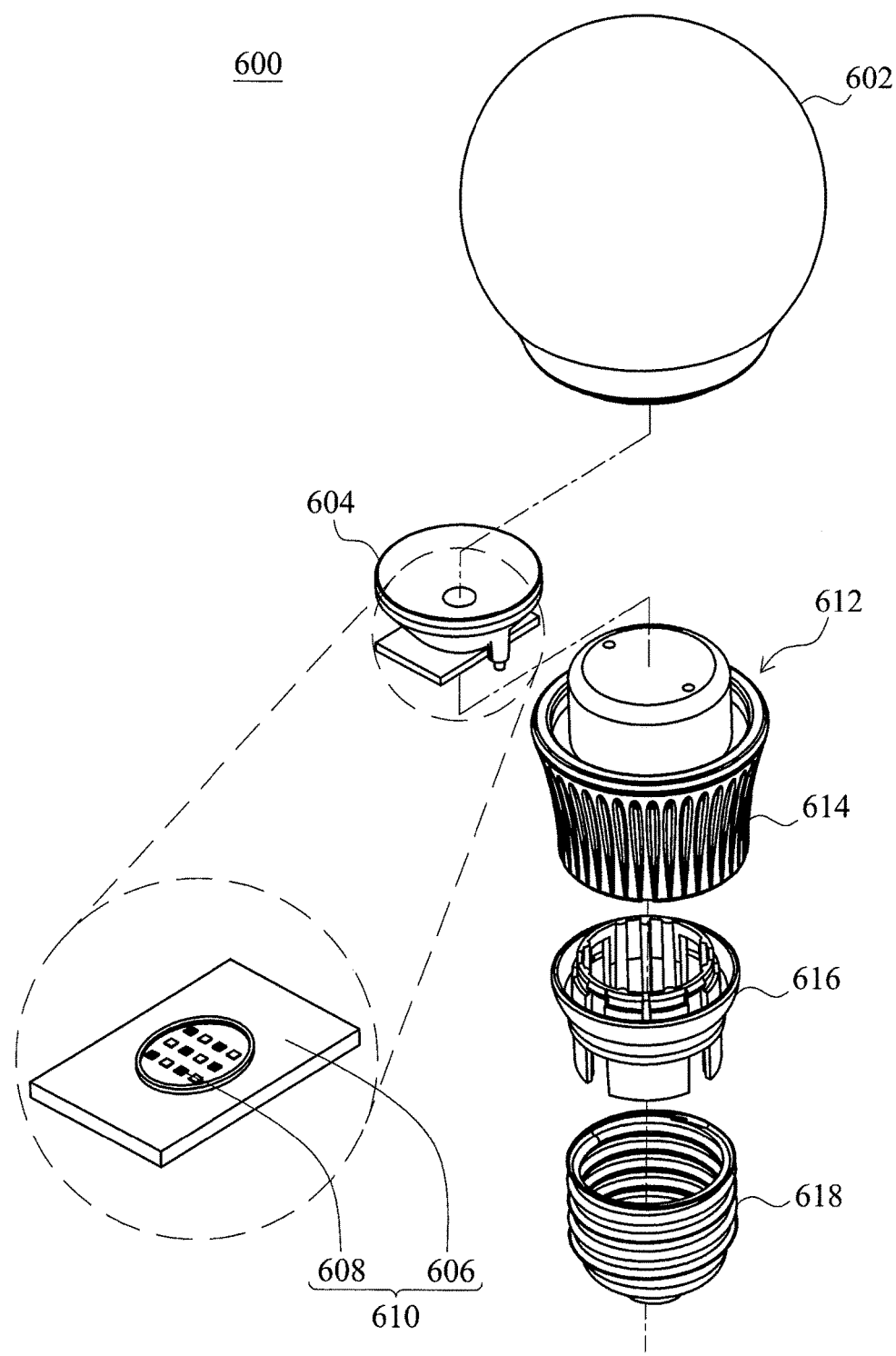
FIG. 26 illustrates a structure diagram of a light-emitting apparatus in accordance with an embodiment of the present application.

FIG. 26 illustrates a structure diagram of a light-emitting apparatus in accordance with an embodiment of the present application. A light bulb 600 comprises an envelope 602, a lens 604, a light-emitting module 610, a base 612, a heat sink 614, a connector 616 and an electrical connecting device 618. The light-emitting module 610 comprises a submount 606 and a plurality of light-emitting devices 608 on the submount 606, wherein the plurality of light-emitting devices 608 can be the light-emitting device 1, 2, 3, 4, 5 or 6 described in above embodiments.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
a semiconductor stack comprising a first semiconductor layer, a second semiconductor layer and an active layer between the first semiconductor layer and the second semiconductor layer;
a first pad on the semiconductor stack;
a second pad on the semiconductor stack, wherein the second pad is separated from the first pad with a distance to define a region between the first pad and the second pad on the semiconductor stack, wherein the first pad comprises a first side and a plurality of first recesses extending from the first side in a direction away from the second pad or the second pad comprises a second side and a plurality of second recesses extending from the second side in a direction away from the first pad; and
multiple vias penetrating the active layer to expose the first semiconductor layer, wherein a part of the multiple vias are formed at positions other than a position of the first pad and the second pad.

2. The light-emitting device of claim 1, wherein the first pad comprises a first opening, the second pad comprises a second opening, and the multiple vias are overlapped with the first opening and the second opening.

3. The light-emitting device of claim 2, wherein the multiple vias comprise an opening comprising a circular shape or an ellipsoidal shape, and comprise a maximum width smaller than a maximum width of the first opening or a maximum width of the second opening.

4. The light-emitting device of claim 1, wherein the first pad comprises a comb shape and the second pad comprises a rectangular shape.

5. The light-emitting device of claim 1, wherein the first pad and the second pad respectively comprises a comb shape, and the first pad and the second pad are formed at positions other than positions of the multiple vias.

6. The light-emitting device of claim 1, wherein the plurality of first recesses is aligned with the plurality of second recesses.

7. The light-emitting device of claim 1, wherein the plurality of first recesses is offset from the plurality of second recesses.

8. The light-emitting device of claim 1, wherein the part of the multiple vias are respectively formed at the plurality of first recesses of the first pad or the plurality of second recesses of the second pad.

9. The light-emitting device of claim 1, further comprising a first insulating layer covering a sidewall of the active layer, wherein the first insulating layer comprises a first insulating opening exposing the second semiconductor layer.

10. The light-emitting device of claim 9, further comprising a transparent conductive layer formed in the first insulating opening, wherein an outer edge of the transparent conductive layer is separated from the first insulating layer with a distance.

11. The light-emitting device of claim 1, further comprising a reflective layer and a barrier layer on the reflective layer, wherein an outer edge of the barrier layer is disposed on an outer side of an outer edge of the reflective layer or overlaps with the outer edge of the reflective layer.

12. The light-emitting device of claim 11, further comprising a second insulating layer on the barrier layer, wherein the second insulating layer comprises a second insulating opening exposing the first semiconductor layer and the second insulating opening comprises a width smaller than a width of the first opening.

13. The light-emitting device of claim 11, further comprising a second insulating layer on the barrier layer, wherein the second insulating layer comprises a second insulating opening exposing the barrier layer.

14. A light-emitting device, comprising:
- a semiconductor stack comprising a first semiconductor layer, a second semiconductor layer and an active layer between the first semiconductor layer and the second semiconductor layer;
- a first pad on the semiconductor stack; and
- a second pad on the semiconductor stack, wherein the second pad is separated from the first pad with a distance to define a region between the first pad and the second pad on the semiconductor stack, wherein the first pad comprises a plurality of first protrusions and a plurality of first recesses, wherein the second pad comprises a plurality of second protrusions and a plurality of second recess, and wherein the plurality of first recesses of the first pad faces the plurality of second recesses of the second pad, and multiple vias penetrating the active layer to expose the first semiconductor layer.

15. The light-emitting device of claim 14, wherein the plurality of first recesses comprises a curvature radius larger or less than a curvature radius of the plurality of second recesses.

16. The light-emitting device of claim 14, wherein the plurality of second protrusions comprises a curvature radius larger or smaller than a curvature of the plurality of first protrusions.

17. A light-emitting device, comprising: a semiconductor stack comprising a first semiconductor layer, a second semiconductor layer and an active layer between the first semiconductor layer and the second semiconductor layer;
- a first pad on the semiconductor stack;
- a second pad on the semiconductor stack, wherein the second pad is separated from the first pad with a distance to define a region between the first pad and the second pad on the semiconductor stack;
- a first contact layer on the first semiconductor layer and a second contact layer on the second semiconductor layer, wherein the first contact layer surrounds the second contact layer; and
- multiple vias penetrating the active layer to expose the first semiconductor layer.

18. The light-emitting device of claim 17, wherein the first contact layer covers the multiple vias and the second contact layer does not cover the multiple vias.

19. The light-emitting device of claim 17, wherein the first contact layer comprises a metal material other than gold (Au).

20. The light-emitting device of claim 17, further comprising:
- a first insulating layer covering a sidewall of the active layer, wherein the first insulating layer comprises a first insulating opening exposing the second semiconductor layer;
- a second insulating layer on the first insulating layer, wherein the second insulating layer comprises a second insulating opening exposing the first semiconductor layer; and
- a third insulating layer on the semiconductor stack, where the third insulating layer comprises a third insulating opening, the third insulating opening being offset from the second insulating opening and the multiple vias.

\* \* \* \* \*